United States Patent [19]

Lipovski

[11] Patent Number: 5,192,882
[45] Date of Patent: Mar. 9, 1993

[54] SYNCHRONIZATION CIRCUIT FOR PARALLEL PROCESSING

[75] Inventor: G. Jack Lipovski, Austin, Tex.
[73] Assignee: Board of Regents, The University of Texas System, Austin, Tex.
[21] Appl. No.: 871,584
[22] Filed: Apr. 20, 1992

Related U.S. Application Data

[63] Continuation of Ser. No. 359,075, May 30, 1989.
[51] Int. Cl.$^5$ .................... H03K 19/21; G06F 7/50
[52] U.S. Cl. ................................ 307/471; 364/784; 364/787
[58] Field of Search .......................... 307/471, 472; 364/784–788

[56] References Cited

U.S. PATENT DOCUMENTS

| | | | |
|---|---|---|---|
| 3,753,238 | 8/1973 | Tutelman | 340/172.5 |
| 3,832,696 | 8/1974 | Nakao et al. | 340/172.5 |
| 4,422,157 | 12/1983 | Uhlenhoff | 364/786 |
| 4,584,661 | 4/1986 | Grundland | 364/787 |
| 4,621,338 | 11/1986 | Uhlenhoff | 364/784 |
| 4,660,165 | 4/1987 | Masumoto | 364/787 |
| 4,677,584 | 6/1987 | Steck | 364/784 |
| 4,718,034 | 1/1988 | Takla et al. | 364/784 |
| 4,718,035 | 1/1988 | Hara et al. | 364/784 |
| 4,752,905 | 6/1988 | Nakagawa et al. | 364/760 |

OTHER PUBLICATIONS

Bush et al., Some Implementations of Segment Sequential Functions pp. 178–185.
Lipovski et al., Lookahead Networks, National Computer Conference, 1982, pp. 153–165.
Lipovski, An Organization for Optical Linkages Between Integrated Circuits, National Computer Conference, 1977, pp. 227–236.
Lipovski, The Architecture of a Large Associative Processor, Spring Joint Computer Conference, 1970, pp. 385–396.
Lipovski et al., Lookahead Networks, National Computer Conference, 1982, pp. 178–185.

Primary Examiner—Edward P. Westin
Assistant Examiner—Andrew Sanders
Attorney, Agent, or Firm—Arnold, White & Durkee

[57] ABSTRACT

An apparatus and method for synchronizing parallel processors utilizing a lookahead synchronization circuit is provided by the present invention. A five gate logic circuit is formed as a cell and this cell can serve as a node in a tree logic operation circuit. The tree is capable of realizing a variety of fetch-and-operation, priority and operation-and-broadcast primitives and the cell can serve in a carry circuit of a binary adder. The tree may be pruned at any point and the circuit will continue to function for those nodes remaining in the tree. Processing elements are attached to leaf nodes of the tree. The present invention is capable of realizing the fetch-and-exclusive-OR, fetch-and-add, fetch-and-AND, fetch-and-OR, fixed priority schema, round-robin priority schema, hogging priority schema, swap, data exchange, broadcast, shift-function, broadcast-from-the-root, AND-and-broadcast, OR-and-broadcast, minimum-and-broadcast, maximum-and-broadcast, exclusive-OR-and-broadcast, fetch-and-minimum, and fetch-and-maximum primitives. The circuit affords significant power in synchronizing parallel processors utilizing simple cells configured in a tree structure.

20 Claims, 13 Drawing Sheets

5,192,882

SYNCHRONIZATION CIRCUIT FOR PARALLEL PROCESSING

BACKGROUND OF THE INVENTION

The invention relates to configuring a five gate logic cell and a tree circuit configuration utilizing the logic cells as nodes in the tree to establish a lookahead synchronization circuit for parallel processors.

A significant problem encountered in parallel processing is the difficulty in efficiently controlling the activities of the multiple processing elements. Specialized circuits have been designed to implement a variety of primitive synchronization functions including fetch-and-op, priority, and other primitives. Fetch-and-op allows simultaneous reads and writes to a memory and includes, for example, fetch-and-add, fetch-and-AND, fetch-and-OR, and fetch-and-exclusive-OR. By way of illustration, the fetch-and-add primitive implements the sequence of indivisible operations of: 1) fetching the variable to be operated on; 2) adding the desired value to the variable; and, 3) returning the new value of the variable. Conventional methods of implementing these primitives in a parallel computing environment have been known to require in excess of 10,000 gates per node in a network.

High costs associated with complex synchronization circuits increase both the costs and the complexity of the parallel computers in which they reside. Further, the increased costs and increased complexity can result in high costs per processing element in a parallel computing environment.

The complexity of the synchronization circuit is further increased when additional primitives are required. Therefore, a less complex synchronization circuit utilizing fewer gates would significantly reduce the costs of a parallel computer. Further, fewer gates in a circuit will reduce delays associated with signals traversing the synchronization circuit.

A single circuit capable of implementing multiple primitives will further reduce circuit complexity, further reduce delays due to throughput in the synchronization circuit and can reduce costs of parallel computers.

SUMMARY OF THE INVENTION

The apparatus and method of the present invention largely solve the problems associated with complex synchronization circuits for parallel processors. The present invention utilizes a tree structured circuit using only five logic gates per cell. Each cell corresponds to a node in the tree. The present invention is readily extendable to handle large numbers of processing elements or pruned to accommodate a smaller number of processing elements.

The present invention includes a basic five logic gate cell where each cell is configurable as a node in a n-level tree logic operation circuit, where n is an integer greater than 1. An arc is a set of connections between two nodes. As used throughout this application, the terms father and son refer to arcs of a node. Each gate is a logic operation circuit able to perform the designated logic function. Each cell comprises circuit input $C_f$ and circuit outputs $I_f$ and $P_f$ of a father, circuit inputs $I_s$ and $P_s$ and circuit output $C_s$ of a primary son of the father, and circuit inputs $I_s$ and $P_s$ and circuit output $C_s$ of a secondary son of the father.

Within each cell, $I_s$ of the primary son is a first input to a first exclusive-OR circuit. $P_s$ of the primary son is a first input to a first AND circuit and is a first input to a second AND circuit. $I_s$ of the secondary son is a second input to the first AND circuit and is a first input to a second exclusive-OR circuit. $P_s$ of the secondary son is a second input to the second AND circuit is a first input to a third AND circuit. $C_f$ of the father is a second input to the third AND circuit and is $C_s$ of the secondary son. The output from the first exclusive-OR circuit is $I_f$ of the father. The output from the second AND circuit is $P_f$ of the father. The output from the second exclusive-OR circuit is $C_s$ of the primary son. The output from the first AND circuit is a second input to the first exclusive-OR circuit. The output from the third AND circuit is a second input to the second exclusive-OR circuit.

Preferably, a plurality of these cells are assembled into a binary tree structure forming a logic operation circuit. As used throughout this application, a full-leaf cell refers to a cell having no cells of the present invention connected to either of its sons, that is, it has two unoccupied sons. A half-leaf cell has a cell of the present invention connected to one of its sons but not to the other. The son with no cell connected to it is an unoccupied son and the son with a cell connected to it is an occupied son. A non-leaf cell has cells connected to both sons and both sons are referred to as occupied sons. Both a full-leaf cell and a half-leaf cell are referred to as leaf cells.

For clarity, the highest level of the tree is designated level 1 and the lowest level of the tree is designated level n where n is an integer greater than 1. Level 1 of the tree contains one logic circuit cell. Level n of the tree contains less than or equal to $2^{(n-1)}$ logic circuit cells. Each non-leaf and half-leaf cell in any level m where m is an integer and where $1 \leq m < n$, has each occupied son exclusively connected to a corresponding cell at level m+1. In particular, the $I_s$, $P_s$ and $C_s$ connections of each level m occupied son are each respectively connected only to the $I_f$, $P_f$ and $C_f$ connections of the corresponding level m+1 cell.

The tree logic operation circuit described above serves as a lookahead synchronization circuit for parallel processors. The processors are connected to both unoccupied sons of full leaf cells. In the case of half-leaf cells, a processor would only be connected to the unoccupied son, that is, the son not connected to an additional node of the tree.

The present invention can implement a variety of primitive or basic functions. In particular, the invention realizes fetch-and-op primitives including fetch-and-exclusive-OR, fetch-and-add, fetch-and-AND, and fetch-and-OR. The present invention can also implement a fixed priority schema, a round-robin priority schema, and a hogging priority schema. Data movement primitives including swap, data exchange, broadcast, shift-function, and broadcast-from-the-root can also be implemented by the present invention. Additionally, op-and-broadcast primitives including AND-and-broadcast, OR-and-broadcast, minimum-and-broadcast, maximum-and-broadcast, exclusive-OR-and broadcast, fetch-and-minimum, and fetch-and-maximum can be realized by the present invention. While fetch-and-op primitives combine requests directed to shared memory, op-and-broadcast primitives combine requests to a communication channel. The general class of op-and-broadcast operations can most easily be described by examining the OR-and-broadcast primitive. This primitive is identical to the wire-OR logic used in computer logic to collect interrupt requests and other status information. Each processing element applies a bit to the network. The network determines the OR of all the bits. This result is broadcast to all processing elements. The op-and-broadcast generalizes this function, where "op" is any associative commutative operation. Further, the circuit can act as the carry circuit of a binary adder.

The high flexibility of the circuit of the present invention and its relatively low cost structure solve many of the problems associated with the high cost and high complexity of synchronizing parallel processors. Use of the circuit of the present invention is not limited to a tree structure. More complex structures, such as a mesh or a banyan may also contain the basic cell of the present invention as well as embedded tree structures. Therefore, more complex structures may utilize the present invention where the more complex structures contain embedded structures and the embedded structures may be multiple independent trees of the present invention.

In addition, a single logic operation circuit cell of the present invention can be utilized in synchronizing two processors and implementing the functions described.

DETAILED DESCRIPTION OF THE PREFERRED EMBODIMENT

Figure 1:
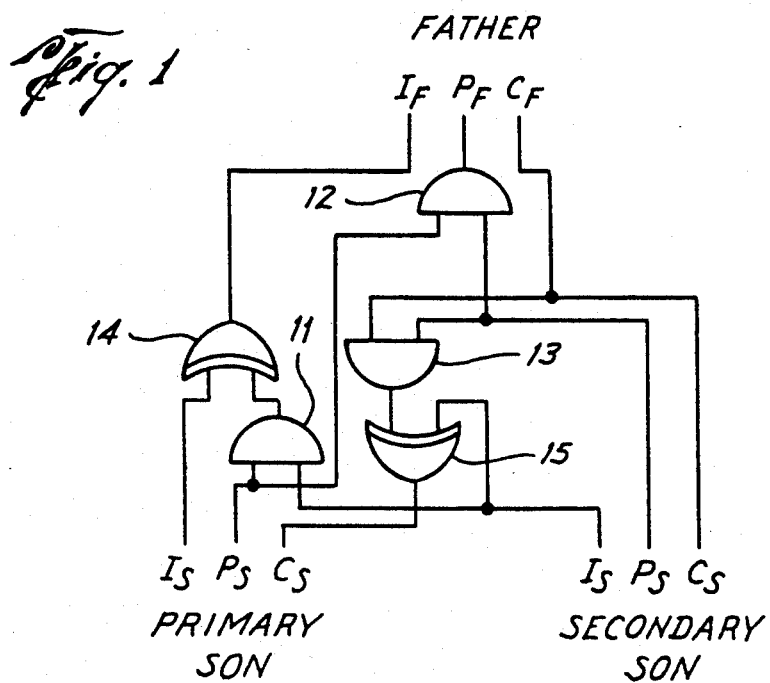
FIG. 1 is a single cell in accordance with the present invention.

FIG. 1 illustrates a preferred embodiment of the logic operation circuit cell of the invention. The input/output connections to the cell are classified as a father ($I_f$, $P_f$ and $C_f$), a primary son ($I_s$, $P_s$ and $C_s$) and a secondary son ($I_s$, $P_s$ and $C_s$) $I_s$ and $P_s$ of each son are inputs to the cell and $C_s$ of each son is an output from the cell. $C_f$ of the father is an input to the cell. $I_f$ and $P_f$ of the are outputs from the cell. The cell of the present invention may be used individually or in an n-level tree logic operation circuit where n is an integer greater than 1 and the tree has a plurality of logic circuit cells of the invention.

As shown in FIG. 1, the logic operation circuit cell of the invention comprises three two-input AND gates 11, 12 and 13, and two two-input exclusive-OR gates 14 and 15. $I_s$ of the primary son is an input to exclusive-OR gate 14. $P_s$ of the primary son is an input to AND gate 11 and an input to AND gate 12. $I_s$ of the secondary son is a second input to AND gate 11 and is an input to exclusive-OR gate 15. $P_s$ of the secondary son is also an input to AND gate 12 and is an input to AND gate 13. $C_f$ is a second input to AND gate 13. $C_f$ is also connected to $C_s$ of the secondary son. The output from exclusive-OR gate 14 is $I_f$. The output from AND gate 12 is $P_f$. The output from exclusive-OR gate 15 is $C_s$ of the primary son. The output from AND gate 11 is a second input to exclusive-OR gate 14. The output from AND gate 13 is also an input to exclusive-OR gate 15.

Figure 2:
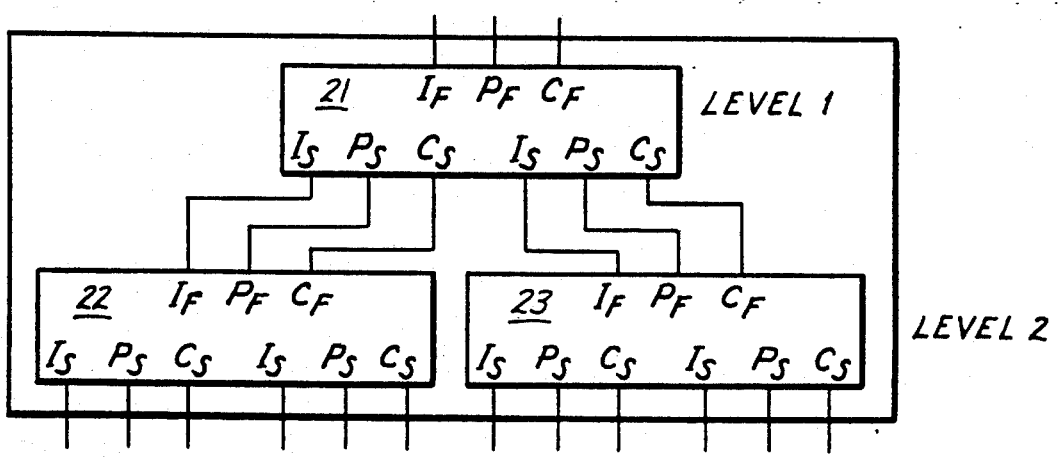
FIG. 2 is a two level logic operation circuit tree in accordance with the present invention.

FIG. 2 illustrates a two-level tree logic operation circuit according to the present invention where each node of the tree is the logic cell of the present invention shown in FIG. 1. As shown in FIG. 2, the level 1 cell 21, also referred to as the root, has its father connections available for external connection. However, connections of both sons of the root cell are to cells 22 and 23 located at level 2 of the tree. Thus, the two-level tree allows for external connections at each of the four sons at level 2.

Figure 3:
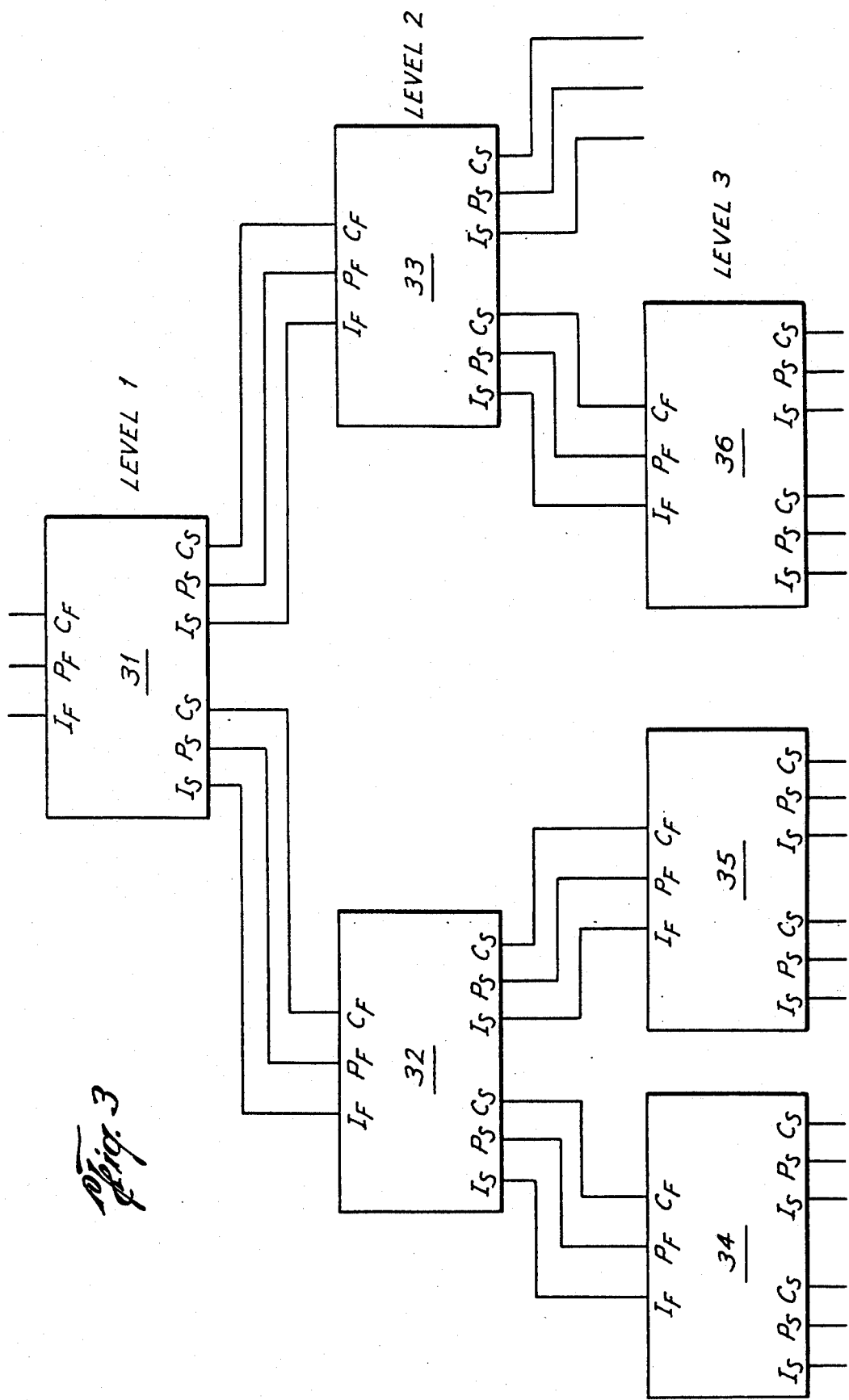
FIG. 3 is a three level logic operation circuit tree in accordance with the present invention.

FIG. 3 illustrates a three-level tree circuit where each node of the tree 31, 32, 33, 34, 35 and 36 is a logic cell of the present invention. Cell 32 is a non-leaf cell because both of its sons are connected to additional cells of the present invention and form part of the tree. Cell 34 is a leaf-cell of the tree. In particular, cell 34 is a full-leaf cell as neither son of cell 34 is connected to an additional cell. Cell 33, while also a leaf cell like cell 34, is a half-leaf cell because one son of cell 33 is not connected to an additional cell. A leaf cell must have at least one son not connected to an additional cell of the tree.

The son of cell 33 connected to the father connections of cell 36 is an occupied son of cell 33. The other son of cell 33, that is not connected to an additional cell of the tree, is an unoccupied son of cell 33. The sons of cells 34, 35 and 36 are all unoccupied sons. These definitions of occupied and unoccupied sons and non-leaf, half-leaf and full-leaf cells are used throughout this application.

FIG. 3 illustrates a significant feature of the present invention, that being that the tree can be pruned at any point while retaining the attributes of the invention. Therefore, in an n-level tree where level 1 corresponds to the highest level in the tree and level 1 comprises a single cell of the invention, and level n corresponds to the lowest level in the tree, the number of cells at level n is less than or equal to $2^{(n-1)}$. Additionally, all non-leaf and half-leaf cells in any level m, where m is an integer and where $1 \leq m < n$, are connected to a corresponding cell at level m+1 as shown in by example in FIG. 3. In particular, cell 31 is located at level 1, cells 32 and 33 are located at level 2, and cells 34, 35 and 36 are located at level 3 in the tree. As shown in FIGS. 2 and 3, $I_f$, $P_f$ and $C_f$ of each level m+1 cell are each respectively connected only to $I_s$, $P_s$ and $C_s$ of the corresponding son of the corresponding, level m cell. A portion of the tree may be pruned by forcing $I_s$ of a level m son and its corresponding $I_f$ of a level m+1 father to a 0 logic level and forcing $P_s$ of the same level m son and its corresponding $P_f$ of the same level m+1 father to a 1 logic level at the arc that is pruned.

Figure 4:
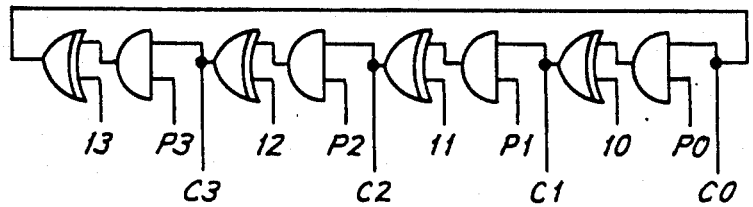
FIG. 4 is a ring circuit in accordance with the present invention.

Analysis of the invention in its tree circuit form may be simplified in particular cases by examining the tree as a logically equivalent ring. The ring can be constructed to be equivalent to the tree where the level 1 cell has $C_f$ equal to $I_f$ logically exclusive-ORed with the result of $P_f$ logically ANDed with $C_f$. Similarly, the n-level binary tree illustrated in FIG. 2 is logically equivalent to a ring as illustrated in FIG. 4 where $C_f = I_f$ in the root of the tree and $P_s$ of an unoccupied son, shown as PO in FIG. 4, is equal to 0 logic level. For clarity, FIG. 4 numbers the unoccupied sons 0-3 and shows PO as the $P_s$ equal to a 0 logic level.

Implementation of the synchronization circuit achieved by the tree circuit of the present invention occurs when the unoccupied sons in the tree are connected to processing elements which may include conventional processors. External input signals used by the tree circuit are supplied from the processing elements and results from the tree circuit of the invention are inputs to the processing elements. This allows the circuit of the present invention to synchronize the processing elements in a parallel processing environment.

A memory variable may be substituted for the processing element in an unoccupied son intended only to receive and store a result from the logic operation circuit of the invention. The unoccupied son requiring only a memory variable and not necessarily requiring a processing element is so indicated in the discussion of the implementation of those particular primitives.

It being understood that the hardware circuit elements described in this application may be implemented using the particular hardware circuitry described, using equivalent software or firmware program code or similar means or using a combination thereof.

The logic operation circuit of the invention, particularly in its tree structure, is capable of implementing a variety of basic instructions, referred to as primitives, that are particularly useful in parallel processing applications. For clarity, two level trees are used for illustrative purposes throughout this application. However, the invention is not so limited and may be used in a n-level tree, where n is a positive integer.

As used throughout this application, " " symbolizes a logical AND function, " " symbolizes a logical OR function, "$\oplus$" symbolizes a logical exclusive-OR function, "+" symbolizes an addition function, and "¯" symbolizes the logical complement function.

1. The Fetch-and-Op Primitives

Fetch-and-op allows simultaneous read and writes to a memory. In all fetch-and-op primitives, all unoccupied sons are ordered from 1 to x where x is an integer and $1 < x \leq 2^n$, and y is an integer and $1 < y \leq x$. The unoccupied son having $P_s$ equal to a 0 logic level is of order 1. Then, for any unoccupied son of order y, its corresponding subset will be the set of unoccupied sons of order y−1 through 1, inclusive.

Further, as used throughout this application, a memory variable can be any type of memory including, but not limited to, a flip-flop, a register, or an external device capable of inputting, holding and supplying a value.

a. The Fetch-and-Exclusive-OR Primitive

Figure 10:
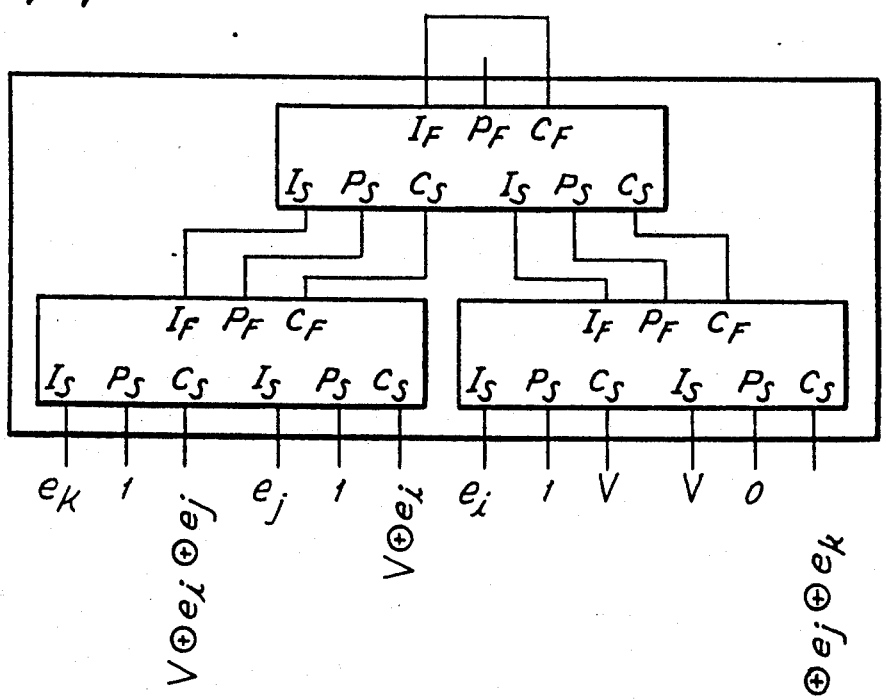
FIG. 10 is a two level logic operation circuit tree in accordance with the present invention performing a fetch-and-exclusive-OR primitive.

As shown in FIG. 10, the fetch-and-exclusive-OR primitive can be implemented in the tree structure of the present invention. In particular, external input signals $e_i$, $e_j$ and $e_k$ are connectable to $I_s$ of all but one unoccupied son. The unoccupied son not having an external input signal has $I_s$ connected to a memory variable V. The unoccupied son connected to the memory variable has $P_s$ connected to a 0 logic level while all other unoccupied sons have $P_s$ connected to a 1 logic level. $I_f$ of the root cell is connected to $C_f$ of the root cell to implement the fetch-and-exclusive-OR primitive.

The memory variable will contain the logical exclusive-OR of all the external input signals and the original memory variable. Further, as seen in the equivalent ring structure of FIG. 4, $C_s$ of each unoccupied son will equal the logical exclusive-OR of the memory variable and a subset, as defined earlier, of external input signals. For example, it can be seen by inspection that C2 equals I1 logically exclusive-ORed with I0 under the conditions established for realizing the fetch-and-exclusive-OR primitive. The memory variable and this subset of the external input signals comprise those input signals logically preceding $C_s$ of the unoccupied son being examined and continuing through the unoccupied son having $P_s$ equal to a 0 logic level. This ordering of unoccupied sons can be readily seen in FIG. 4.

Each multiple-bit external input signal is able to provide the information encoded in the input signal in a serial format. The input signals may all be provided either most significant bit first or may all be provided least significant bit first. Alternatively, the external input signals may be single bit.

b. The Fetch-and-Add Primitive

Figure 11:
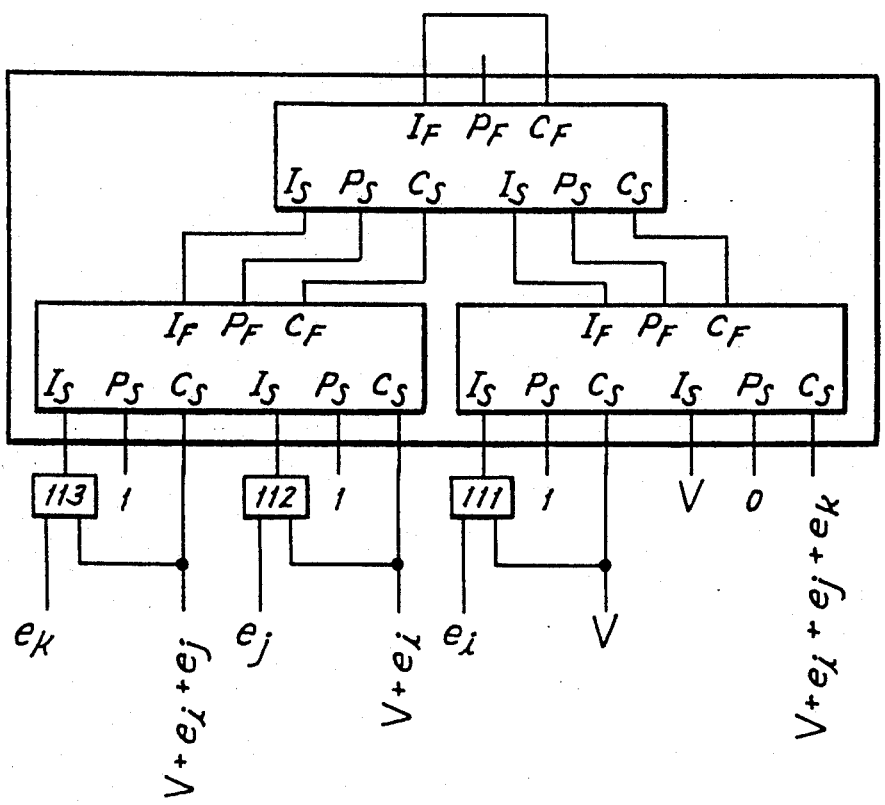
FIG. 11 is a two level logic operation circuit tree in accordance with the present invention performing a fetch-and-add primitive.

As shown in FIG. 11, the fetch-and-add primitive can be implemented in the tree structure of the present invention. In implementing this primitive, one unoccupied son has $P_s$ equal to a 0 logic level and $I_s$ connected to a memory variable V.

A bit store device, as used throughout this application, includes but is not limited to, an edge-triggered D type flip-flop, an edge-triggered R-S flip-flop, or functionally equivalent structures. Each bit store device has a present time input and a delay time output. The delay time output corresponds to the carry variable in a binary serial adder. A bit store device transfers the present time input value to the delay time output value during the period between the arrival of each bit in the serial bit stream.

A bit store device corresponds to each unoccupied son of the logic operation circuit except the son connected to the memory variable. A connectable external input signal, $e_i$, $e_j$ and $e_k$ corresponds to each unoccupied son excluding the unoccupied son connected to the memory variable. Each external input signal is exclusive-ORed with its corresponding delay time output and this result is connected to $I_s$ of each corresponding unoccupied son. Similarly, for each unoccupied son associated with a bit store device, $P_s$ is equal to a 1 logic level. The input of each bit store device is connected to the output of a corresponding majority circuit. Each majority circuit has a first, second and third input. Each first input is connected to $C_s$ of the corresponding unoccupied son, each second input is connectable to the corresponding unoccupied son's external input signal and each third input is connected to the corresponding unoccupied son's delay time output. The bit store and majority circuit logic may also be implemented in program code in part or in whole, as shown by control blocks 111, 112 and 113 in FIG. 11.

Further, $I_f$ of the level 1 cell is connected to $C_f$ of the level 1 cell to implement the fetch-and-add primitive. The output value of a majority circuit is the value of the majority of its inputs. Table 1 is a truth table for a three-input majority circuit.

TABLE 1

| 3 INPUT MAJORITY CIRCUIT TRUTH TABLE | | | |
|---|---|---|---|
| INPUT 1 | INPUT 2 | INPUT 3 | OUTPUT |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

To utilize the fetch-and-add primitive, each bit store device initially has a 0 logic level as its delay time output. Each corresponding external input signal is able to provide the information encoded in the input signal in a serial format having the least significant bit first. The result of the fetch-and-add will appear at $C_s$ of the unoccupied son having $P_s$ equal to a 0 logic level. Each $C_s$ of all other unoccupied sons will indicate the sum of a subset, as defined earlier, of the external input signals.

Figure 5:
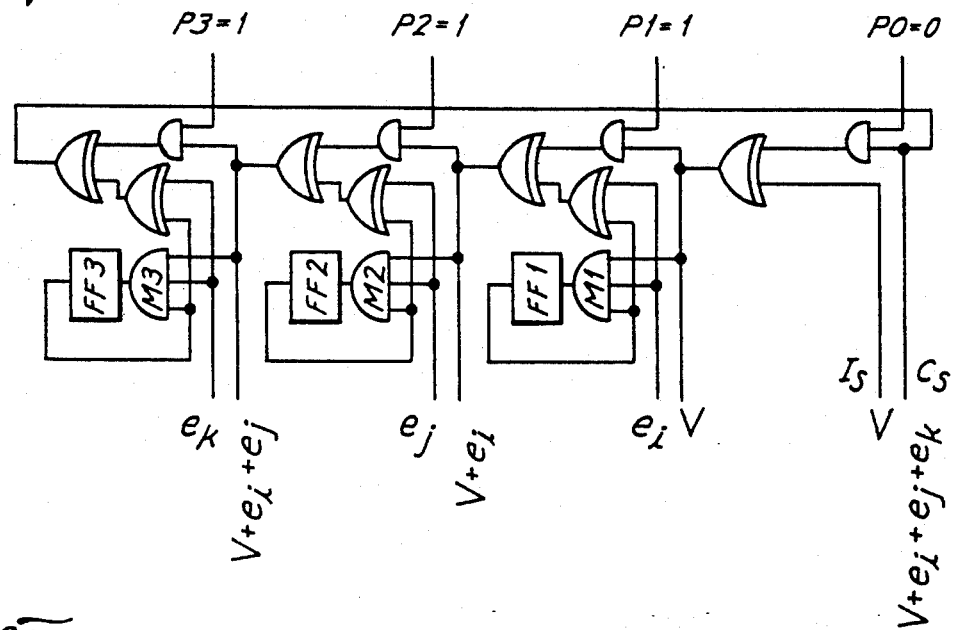
FIG. 5 is a fetch-and-add circuit in accordance with the present invention.

FIG. 5 illustrates a preferred embodiment of an implementation of the fetch-and-add primitive. In FIG. 5, P0 represents $P_s$ of the unoccupied son having $P_s=0$. P1, P2 and P3 represent $P_s$ of three other unoccupied sons in a two-level binary tree. Circuit elements M1, M2 and M3 each represent a majority circuit and FF1, FF2 and FF3 represent bit store devices corresponding to unoccupied sons having $P_s$ equal to 1. Further, ei, ej and ek represent corresponding external input signals. The result of the fetch-and-add, that is the sum of $e_i$, $e_j$, $e_k$ and the original value of V, appears at $C_s$ of the unoccupied son having $P_s$ equal to a 0 logic level.

Figure 6:
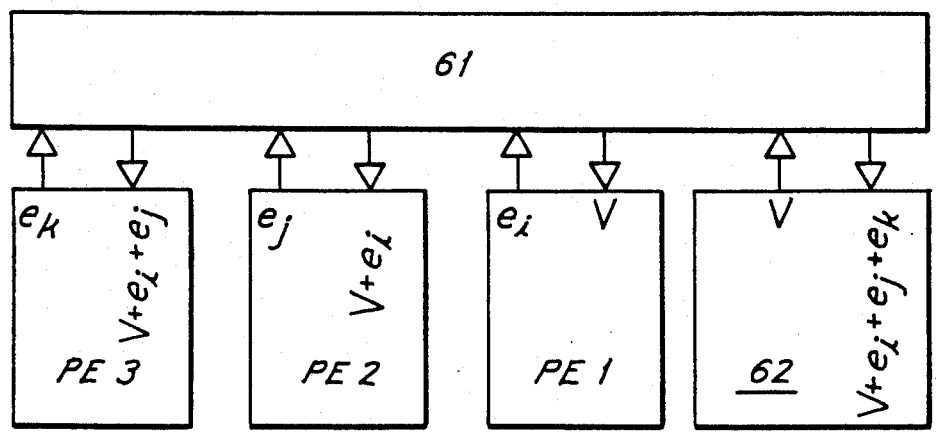
FIG. 6 is a fetch-and-add block diagram including processing elements in accordance with the present invention.

FIG. 6 shows parallel processing elements configured to implement the fetch-and-add realization. As discussed, hardware circuitry, including but not limited to a bit store device and a majority circuit, may be partly or completely replaced by other external logic or software capable of producing values as described, or by processing elements as shown in FIG. 6. Block 61 in FIG. 6 is the tree of the present invention as shown by the equivalent ring of FIG. 11. PE1, PE2 and PE3 are processing elements and block 62 is a memory variable.

c. The Fetch-and-AND Primitive

Figure 12:
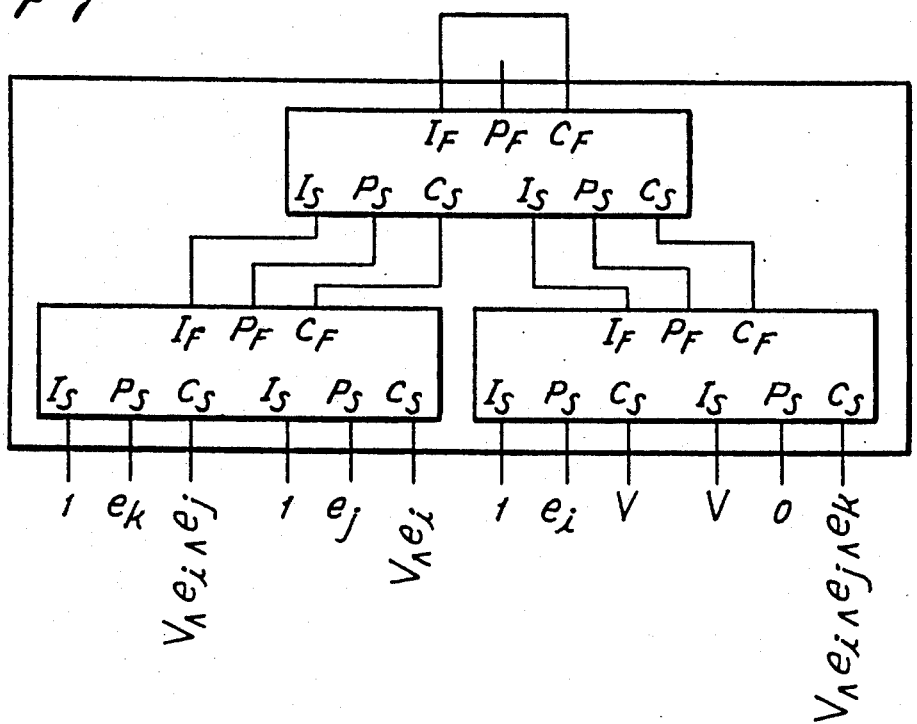
FIG. 12 is a two level logic operation circuit tree in accordance with the present invention performing a fetch-and-AND primitive.

As shown in FIG. 12, the fetch-and-AND primitive can also be implemented by the present invention. In a preferred embodiment, an unoccupied son has $P_s$ equal a 0 logic level and $I_s$ connected to a memory variable V. All other unoccupied sons have $I_s$ equal a 0 logic level and have each $P_s$ connected to a corresponding external input signal $e_i$, $e_j$ and $e_k$. Additionally, $I_f$ of the level 1 cell is connected to $C_f$ of the level 1 cell.

The unoccupied son having $P_s$ equal to a 0 logic level has the logical AND of all external input signals and the memory variable at its $C_s$ output. Each external input signal is able to provide the information encoded in the input signal in a serial format. The input signals may all be provided either most significant bit first or may all be provided least significant bit first.

Each $C_s$ of all other unoccupied sons each will provide the logical AND of a subset of the external input signals and the memory variable.

d. The Fetch-and-OR Primitive

Figure 13:
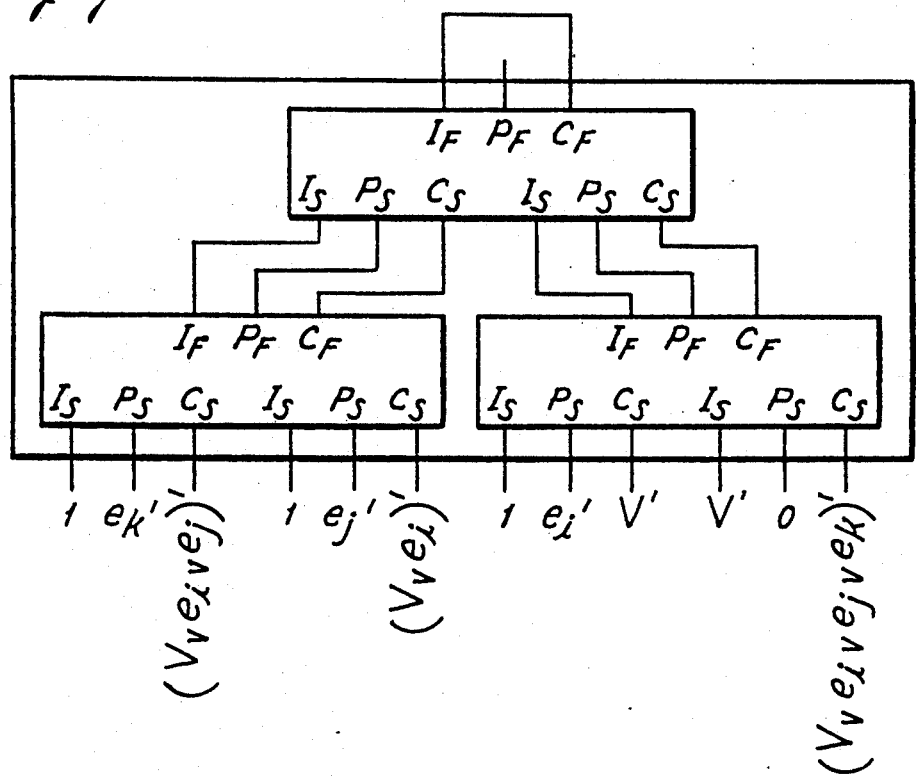
FIG. 13 is a two level logic operation circuit tree in accordance with the present invention performing a fetch-and-OR primitive.

As shown in FIG. 13, the fetch-and-OR primitive can also be realized by the logic operation of the invention. In a preferred embodiment, one unoccupied son has $P_s$ equal to a 0 logic level and $I_s$ connected to the complement of a memory variable V. All other unoccupied sons have $I_s$ equal to a 0 logic level and have each $P_s$ connected to the complement of a corresponding external input signal $e'_i$, $e'_j$ and $e'_k$. Additionally, If of the level 1 cell is connected to $C_f$ of the level 1 cell.

In operation, the unoccupied son having $P_s$ equal to a 0 logic level has its $C_s$ output equal to the complement of the logical OR of all external input signals and the memory variable. Each of the other unoccupied sons has $C_s$ equal to the complement of the logical OR of a subset of the external input signals and the memory variable. Each external input signal is able to provide the information encoded in the input signal in a serial format. The input signals may all be provided either most significant bit first or may all be provided least significant bit first.

2. Priority-Circuit Realizations

The tree logic operation circuit of the present invention is also capable of realizing fixed priority, round-robin priority and hogging priority schemas. A fixed priority schema orders the sons the same way at all times. A round-robin priority schema makes the son that last won the priority arbitration the lowest priority contender in the next arbitration. The hogging priority schema makes the cell that last won the priority arbitration the highest priority contender in the next arbitration. Throughout the discussion of priority-circuit realizations, a 1 logic level from an external input signal represents a request for priority to use the resource being allocated.

Regardless of the priority-circuit realization implemented, the unoccupied sons are ordered. As used throughout the specification and noted earlier, references to the ordering of the unoccupied sons indicates that each unoccupied son is logically located in a chain and that an examination of the chain will occur in the order in which the sons appear in the chain. The starting position in the chain may, however, be varied. Thus, a fixed priority schema will always begin from the same position in the chain; a round-robin priority schema will begin at the unoccupied son in the chain following the last unoccupied son to win priority; and a hogging-priority schema will begin in the chain with the last unoccupied son to win priority.

a. The Fixed Priority Schema

Figure 14:
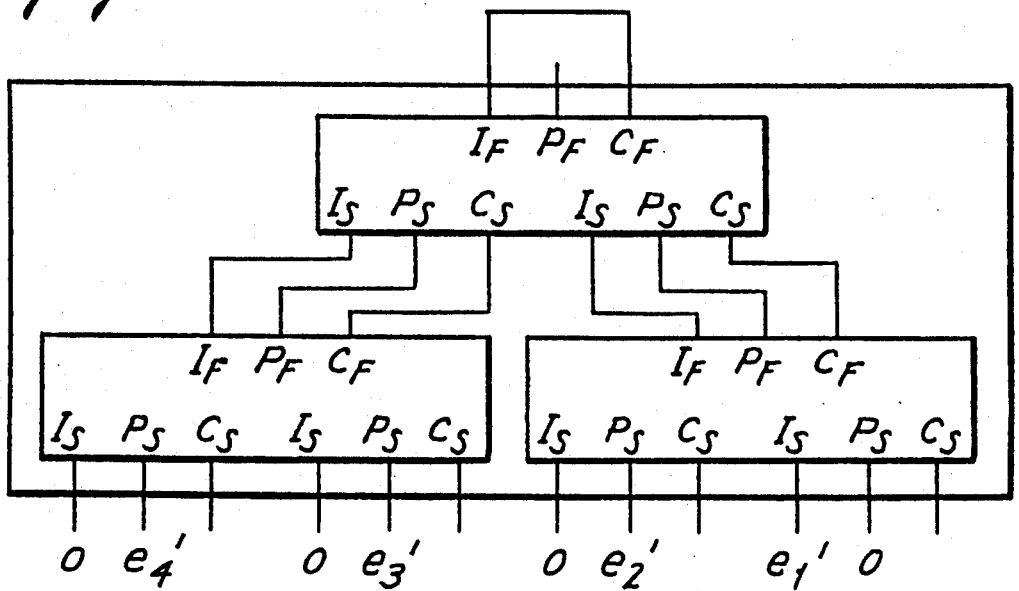
FIG. 14 is a two level logic operation circuit tree in accordance with the present invention realizing a fixed priority schema.

As in all priority circuit realizations, the unoccupied sons are ordered. In the fixed priority schema shown in FIG. 14, the highest ordered unoccupied son being able to dominate all other unoccupied sons in gaining priority. In the highest ordered unoccupied son, $P_s$ is equal to a 0 logic level and $I_s$ is connected to the complement of the unoccupied son's corresponding external input signal $e'_1$. In all other sons, $I_s$ is equal to a 0 logic level and $P_s$ is connected to the complement of each unoccupied son's corresponding external input signal $e'_2$, $e'_3$ and $e'_4$. Additionally, $I_f$ of the level 1 cell is connected to $C_f$ of the level 1 cell.

Priority is granted in the fixed priority schema in one of two cases. First, in the case of the unoccupied son having $P_s$ equal to a 0 logic level, priority is granted when the external input signal is equal to a 1 logic level. In each other case, priority is granted when the corresponding external input signal logically ANDed with $C_s$ of that unoccupied son produces a 1 logic level.

b. The Round-Robin Priority Schema

Figure 15:
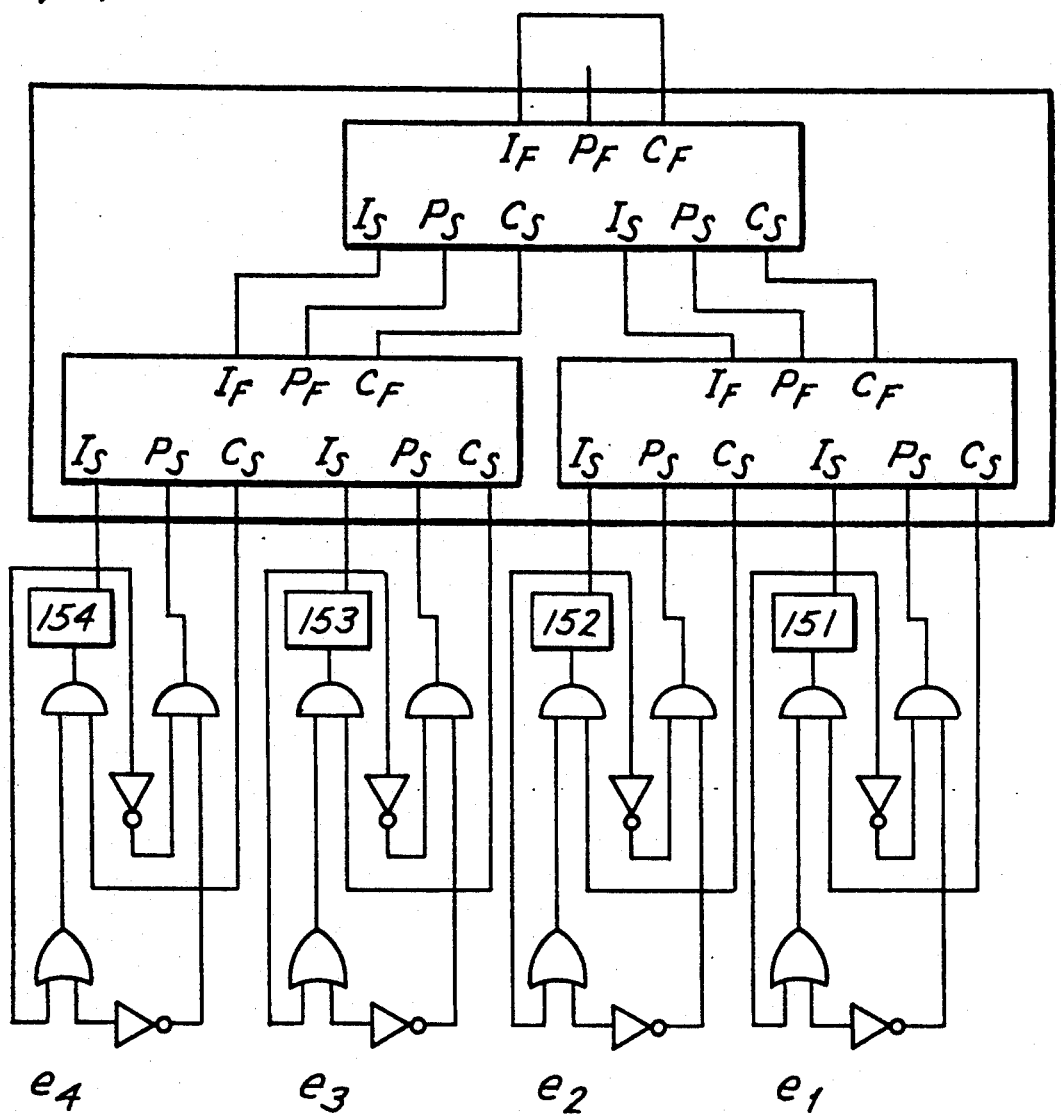
FIG. 15 is a two level logic operation circuit tree in accordance with the present invention realizing a round-robin priority schema.

In a preferred embodiment as shown in FIG. 15, a round-robin priority schema can also be realized from the tree logic operation circuit of the present invention. All unoccupied sons are ordered and a bit store device 151, 152, 153 and 154 having a present time input and a delay time output is connected to each unoccupied son. $P_s$ of each unoccupied son is connected to the complement of its corresponding delay time output logically ANDed with the complement of its corresponding external input signal. Four external input signals $e_1$, $e_2$, $e_3$ and $e_4$ are shown in FIG. 15. $I_s$ of each unoccupied son is connected to its corresponding delay time output. Each external input signal is logically ORed with its corresponding delay time output the result of which is logically ANDed with its corresponding $C_s$ producing the present time input for its corresponding unoccupied son. $I_f$ of the level 1 cell is connected to $C_f$ of the level 1 cell. As previously discussed, the circuitry, including but not limited to the bit store device, the AND gates, the OR gates, and the inverters may be implemented in hardware, software, firmware or other similar means either in whole or in part.

Priority is granted in the round-robin schema when an external input signal logically ANDed with its corresponding $C_s$ produces a 1 logic level.

c. The Hogging Priority Schema

The logic operation circuit of the present invention is also capable of implementing a hogging priority. In a preferred embodiment, all unoccupied sons are ordered and each has a corresponding bit store device having a present time input and a delay time output.

Each unoccupied son has $P_s$ equal to the complement of a corresponding external input signal logically ANDed with the complement of its corresponding delay time output. Further, each unoccupied son has $I_s$ equal to its corresponding delay time output logically ANDed with the complement of its corresponding external input signal. Each present time input is connected to the output of a corresponding three-input majority circuit. The first input of the majority circuit is $C_s$ of its corresponding unoccupied son. The second input of the majority circuit is the external input signal of its corresponding unoccupied son. The third input of the majority circuit is the delay time output of its corresponding unoccupied son.

$I_f$ of the level 1 cell is connected to $C_f$ of the level one cell.

The circuit realizes the hogging priority and grants priority to the unoccupied son when $C_s$ of the unoccupied son logically ORed with its corresponding delay time output the result of which is logically ANDed with its corresponding external input signal produces a 1 logic level.

As in all priority-circuit schemas, only one unoccupied son is granted priority at any given time.

3. The Data Movement Primitives a. The Swap and Data-Exchange Primitives

Figure 16:
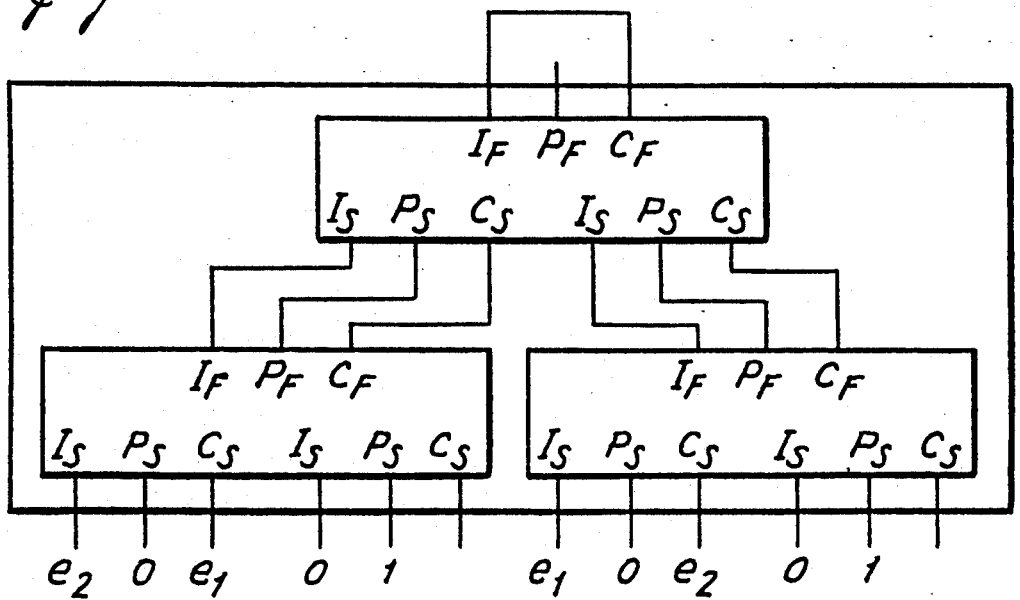
FIG. 16 is a two level logic operation circuit tree in accordance with the present invention performing swap and data-exchange primitives.

As shown in FIG. 16, the logic operation circuit of the present invention is further capable of performing a swap primitive. In a swap, information is exchanged between two unoccupied sons. To select the unoccupied sons in which data will be swapped, $P_s$ of both selected sons is equal to a 0 logic level and the data to be swapped is in the form of external input signals $e_1$ and $e_2$ connected to $I_s$ of the selected unoccupied sons. For all other unoccupied sons, $P_s$ is equal to a 1 logic level and $I_s$ is equal to a 0 logic level. Additionally, $I_f$ of the level 1 cell is connected to $C_f$ of the level 1 cell.

In this configuration, the value of the external input signal associated with the first selected unoccupied son appears at $C_s$ of the second selected unoccupied son. Additionally, the external input signal associated with the second unoccupied son appears at $C_s$ of the first unoccupied son thus swapping data between the selected unoccupied sons. Each external input signal is able to provide the information encoded in the input signal in a serial format. The input signals may all be provided either most significant bit first or may all be provided least significant bit first.

Similarly, a data-exchange primitive can be realized under this configuration of the invention. Under a data exchange, a set of unoccupied sons is selected and data from one unoccupied son is sent to the other unoccupied son in the manner described above.

b. The Broadcast Primitive

Figure 17:
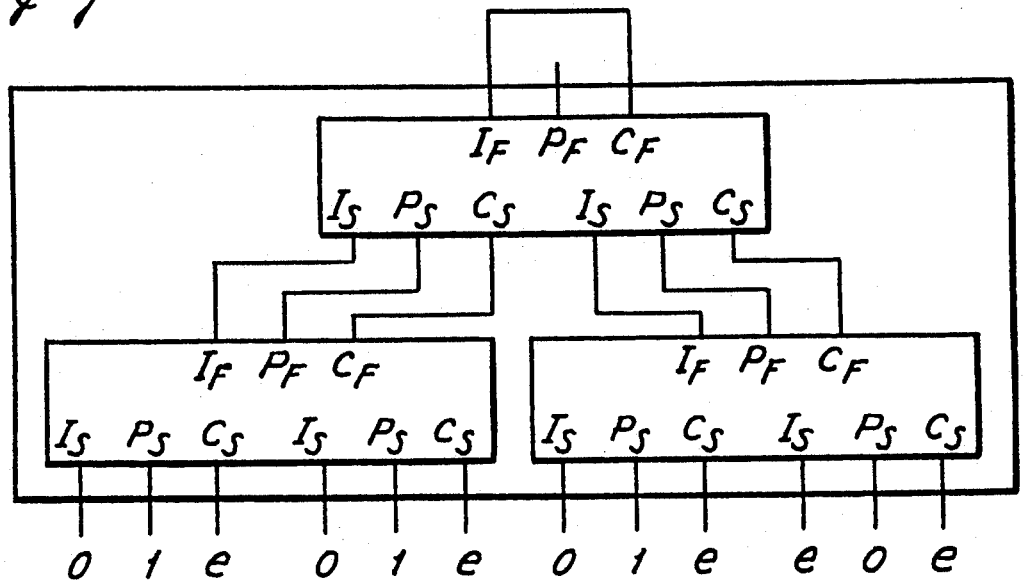
FIG. 17 is a two level logic operation circuit tree in accordance with the present invention performing a broadcast primitive.

As shown in FIG. 17, broadcast primitive can also be realized using the present invention. In the broadcast primitive, data e from a selected unoccupied son is sent to $C_s$ of all other unoccupied sons. For the selected unoccupied son, $P_s$ equals a 0 logic level and $I_s$ is connected to an external input signal. For all other unoccupied sons, $P_s$ is set equal to a 1 logic level and $I_s$ is set equal to a 0 logic level. Additionally, $I_f$ of the level 1 cell is connected to $C_f$ of the level 1 cell.

In use, the external input signal appears at $C_s$ of all unoccupied sons. Each external input signal is able to provide the information encoded in the input signal in a serial format. The input signals may all be provided either most significant bit first or may all be provided least significant bit first. In a parallel processing environment, where processing elements are connected to the unoccupied sons, the selected external input signal is broadcast to all unoccupied sons and therefore, broadcast to their corresponding processing elements.

c. The Shift Function Primitive

Figure 18:
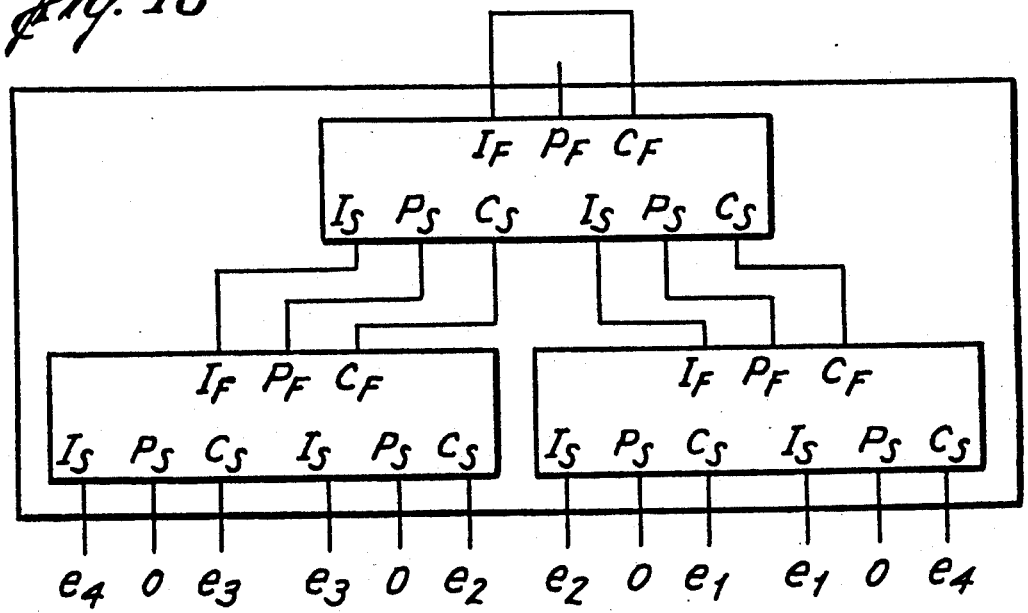
FIG. 18 is a two level logic operation circuit tree in accordance with the present invention performing a shift function primitive.

As shown in FIG. 18, the logic operation circuit of the present invention is also capable of realizing a shift function primitive. In a shift function, data $e_1$, $e_2$, $e_3$ and $e_4$ from each unoccupied son is sent to its neighboring unoccupied son. To establish neighboring unoccupied sons, all unoccupied sons are ordered. For all unoccupied sons, $P_s$ equals a 0 logic level, and each $I_s$ is connected to a corresponding external input signal. Additionally, $I_f$ at the level 1 cell is connected to $C_f$ of the level 1 cell.

In operation, all unoccupied sons are ordered from 1 to x where x is an integer and $1 < x \leq 2^n$. Further, y is an integer and $1 < y \leq x$. For an unoccupied son of order $y-1$, its neighboring unoccupied son will be the unoccupied son of order y. Therefore, the external input signal connected to the unoccupied son of order $y-1$ will be equal to $C_s$ of the unoccupied son of order y. Further, the associated external input signal of the unoccupied son of order x is equal to $C_s$ of the unoccupied son of order 1.

Each external input signal is able to provide the information encoded in the input signal in a serial format. The input signals may all be provided either most significant bit first or may all be provided least significant bit first.

d. Broadcast-from-the-Root Primitive

Figure 19:
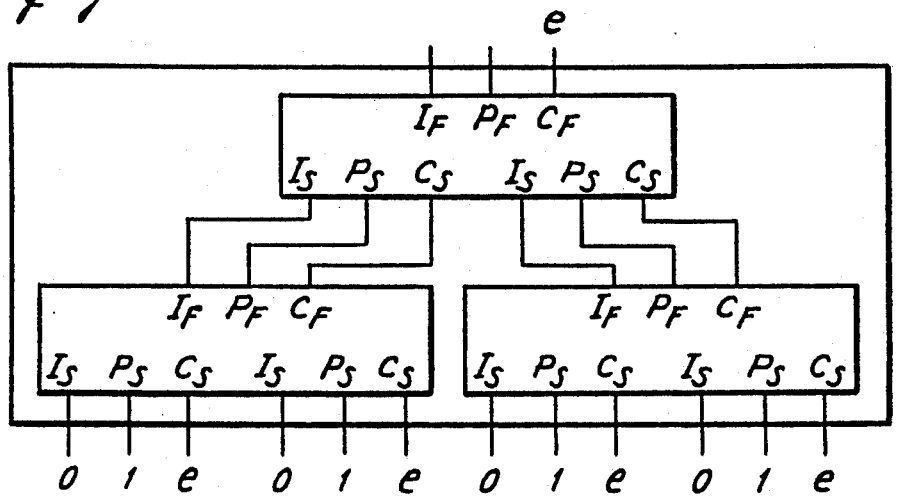
FIG. 19 is a two level logic operation circuit tree in accordance with the present invention performing a broadcast-from-the-root primitive.

The logic operation circuit of the present invention can also realize the broadcast-from-the-root primitive. The root, also known as the level 1 cell, has input $C_f$. When $P_s$ is set equal to a 1 logic level and $I_s$ is set equal to a 0 logic level in all unoccupied sons, $C_s$ in all unoccupied sons will be equal to $C_f$ of the level 1 cell. In FIG. 19, data e is broadcast and this realizes the broadcast-from-the-root primitive. Each external input signal is able to provide the information encoded in the input signal in a serial format. The input signals may all be provided either most significant bit first or may all be provided least significant bit first.

4. The Op-and-Broadcast Primitives

Because the op-and-broadcast primitives do not necessarily meet the criteria established for analysis as an equivalent ring, the realizations of these primitives should not be examined in terms of an equivalent ring structure but should be analyzed in a tree structure.

a. The AND-and-Broadcast Primitive

Figure 20:
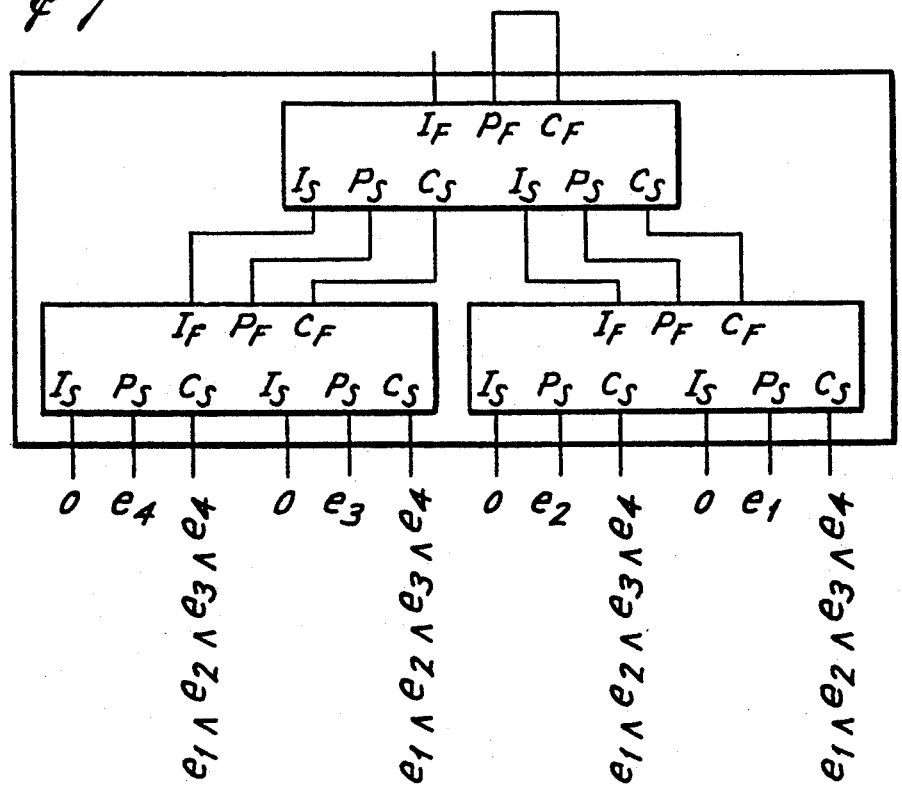
FIG. 20 is a two level logic operation circuit tree in accordance with the present invention performing an AND-and-broadcast primitive.

As shown in FIG. 20, the logic operation circuit of the present invention is further able to realize the AND-and-broadcast primitive. $I_s$ of each unoccupied son equals a 0 logic level and each $P_s$ is connected to a corresponding external input signal $e_1$, $e_2$, $e_3$ and $e_4$. $P_f$ of the level 1 cell is connected to $C_f$ of the level 1 cell.

This implements the AND-and-broadcast primitive. $C_s$ of all unoccupied sons is equal to the logical AND of all the external input signals. Each external input signal is able to provide the information encoded in the input signal in a serial format. The input signals may all be provided either most significant bit first or may all be provided least significant bit first.

b. The OR-and-Broadcast Primitive

Figure 21:
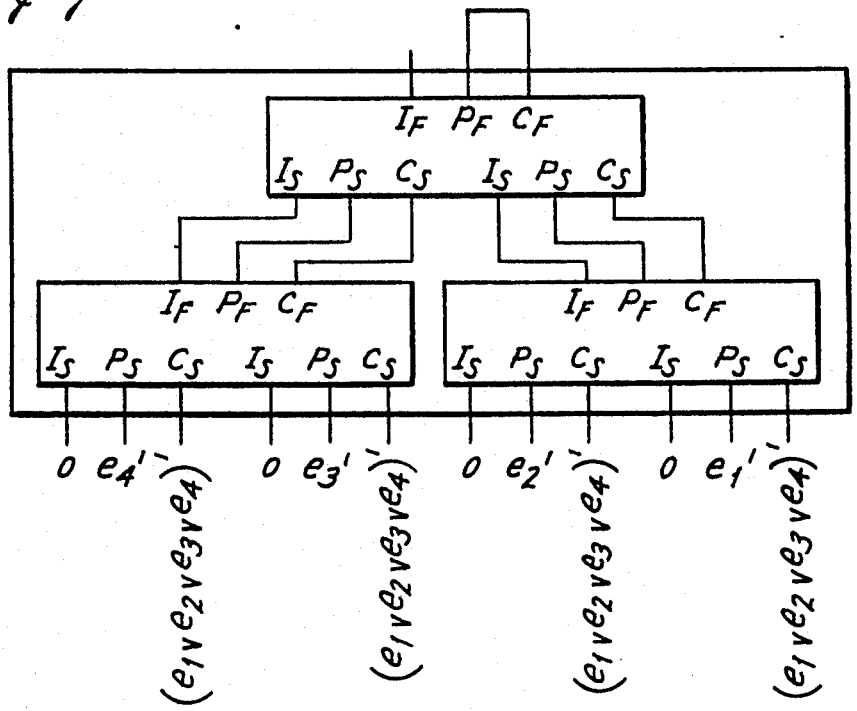
FIG. 21 is a two level logic operation circuit tree in accordance with the present invention performing an OR-and-broadcast primitive.

As shown in FIG. 21, the logic operation circuit of the present invention is also capable of realizing the OR-and-broadcast primitive. The implementation of the OR-and-broadcast primitive comprises setting $I_s$ of all unoccupied sons equal to a 0 logic level and connecting each $P_s$ to the complement of a corresponding external input signal $e'_1$, $e'_2$, $e'_3$ and $e'_4$. Additionally, $P_f$ of the level 1 cell is connected to $C_f$ of the level 1 cell.

The complement of each $C_s$ of each unoccupied son is equal to the logical OR of all the external input signals. Each external input signal is able to provide the information encoded in the input signal in a serial format. The input signals may all be provided either most significant bit first or may all be provided least significant bit first. This realizes the OR-and-broadcast primitive.

c. The Minimum-and-Broadcast Function

Figure 22:
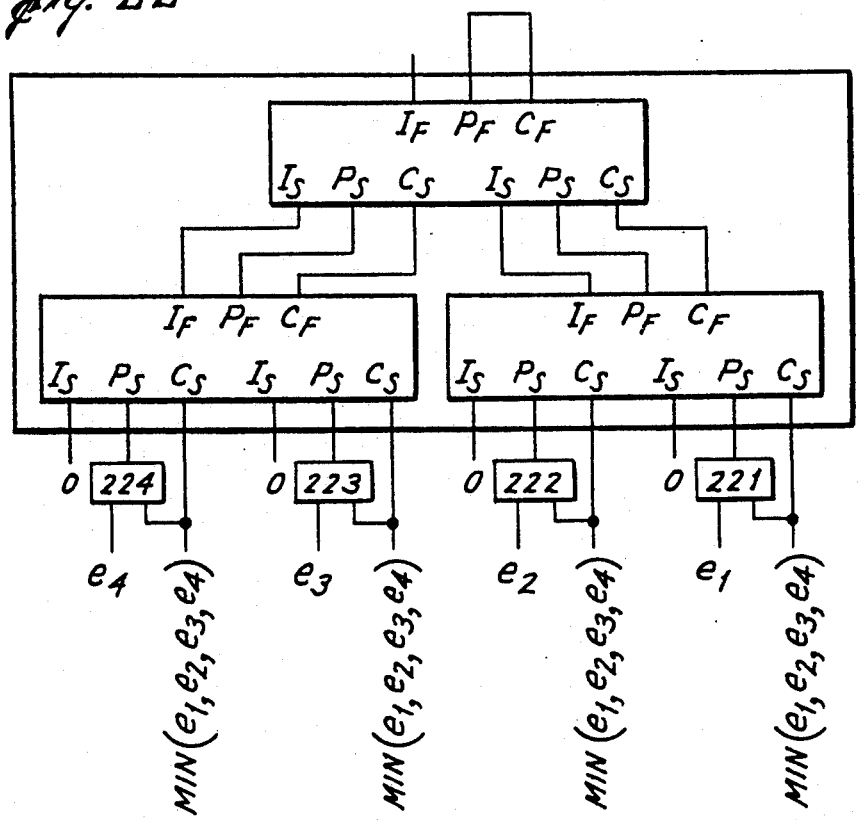
FIG. 22 is a two level logic operation circuit tree in accordance with the present invention performing a minimum-and-broadcast function.

As shown in FIG. 22, the logic operation circuit of the present invention is further capable of implementing the minimum-and-broadcast primitive. Each unoccupied son is connected to a corresponding bit store device 221, 222, 223 and 224 having a present time input and a delay time output. $I_s$ of each unoccupied son equals a 0 logic level. $P_s$ of each unoccupied son is connected to a corresponding external input signal logically ORed with its corresponding delay time output. $C_s$ of each unoccupied son is logically exclusive-ORed with its corresponding external input signal and this result is logically ORed with its corresponding delay time output, each producing the present time input for its corresponding unoccupied son. The input signals are shown as $e_1$, $e_2$, $e_3$ and $e_4$ in FIG. 22. Additionally, $P_f$ of the level 1 cell is connected to $C_f$ of the level 1 cell.

In operation, each external input signal is able to provide the information encoded in the input signal in a serial format having the most significant bit first. $C_s$ of all the unoccupied sons is equal to the minimum value of all the external input signals.

d. The Maximum-and-Broadcast Primitive

Figure 23:
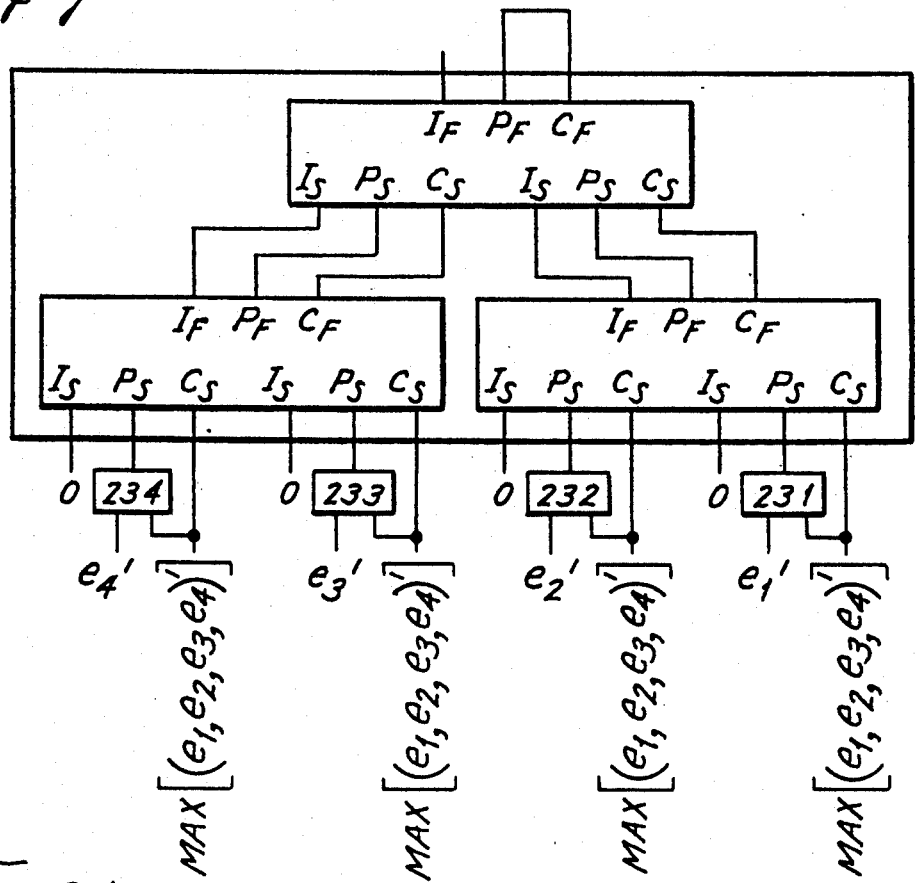
FIG. 23 is a two level logic operation circuit tree in accordance with the present invention performing a maximum-and-broadcast primitive.

As shown in FIG. 23, the logic operation circuit of the present invention is also capable of realizing the maximum-and-broadcast primitive. Each unoccupied son is connected to a corresponding bit store device 231, 232, 233 and 234 having a present time input and a delay time input. $I_s$ of each unoccupied son is equal to a 0 logic level. $P_s$ of each unoccupied son is connected to the complement of a corresponding external input signal logically ORed with its corresponding delay time output. The input signals are shown as $e_1$, $e_2$, $e_3$ and $e_4$ in FIG. 23. $C_s$ of each unoccupied son is logically exclusive-ORed with the complement of its corresponding external input signal and this result is logically ORed with its corresponding delay time output, each producing the present time input for its corresponding unoccupied son. Additionally, $P_f$ of the level 1 cell is connected to $C_f$ of the level 1 cell.

In operation, each external input signal is able to provide the information encoded in the input signal in a serial format having the most significant bit first. The complement of $C_s$ of all the unoccupied sons is equal to the maximum value of all the external input signals.

e. The Exclusive-OR-and-Broadcast Primitive

Figure 24:
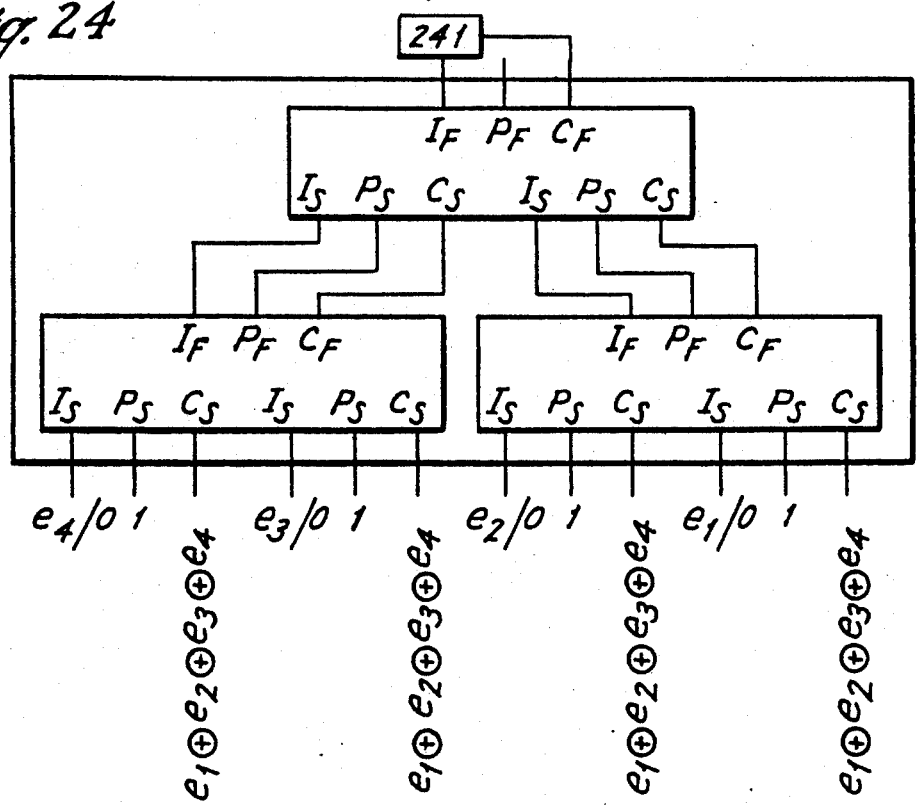
FIG. 24 is a two level logic operation circuit tree in accordance with the present invention performing an exclusive-OR-and-broadcast primitive.

As shown in FIG. 24, the logic operation circuit of the present invention is also capable of realizing an exclusive-OR-and-broadcast primitive. Two steps are required in the realization. In step 1, a bit store device 241 having a present time input and a delay time output has its present time input connected to $I_f$ of the level 1 cell, $I_s$ of each unoccupied son is connected to a corresponding external input signal $e_1$, $e_2$, $e_3$ and $e_4$, and $P_s$ of each unoccupied son is connected to a 1 logic level. In step 2, $P_s$ of each unoccupied sons remains connected to a 1 logic level, however, $I_s$ of all unoccupied sons is connected to a 0 logic level, and the delay time output is connected to $C_f$ of the level 1 cell.

$C_s$ of all the unoccupied sons is equal to the logical exclusive-OR of all the external input signals. Each external input signal is able to provide the information encoded in the input signal in a serial format. The input signals may all be provided either most significant bit first or may all be provided least significant bit first. This realizes the exclusive-OR-and-broadcast primitive.

f. The Fetch-and-Minimum Primitive

Figure 25:
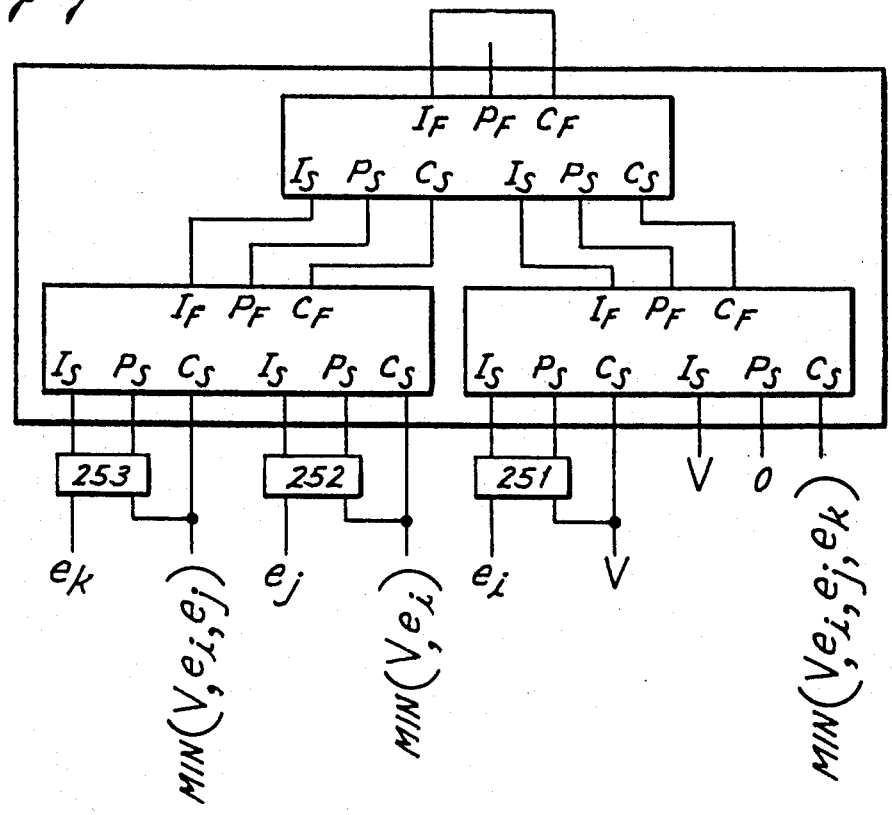
FIG. 25 is a two level logic operation circuit tree in accordance with the present invention performing a fetch-and-minimum primitive.

As shown in FIG. 25, the present invention is also able to realize a fetch-and-minimum primitive. $I_s$ of an unoccupied son, designated the first son, is connected to a memory variable V. $P_s$ of the first son is connected to a 0 logic level. All other unoccupied sons each has a corresponding first and second bit store device, shown collectively in FIG. 25 as blocks 251, 252 and 253, and each bit store device has a present time input and a delay time output. $I_s$ of each unoccupied son, other than the first son, is connected to the delay time output of its corresponding first bit store device logically ANDed with a corresponding external input signal $e_1$, $e_2$, $e_3$ and $e_4$. Further, all unoccupied sons, other than the first son, each has its corresponding external input signal logically ANDed with the complement of the delay time output of its corresponding first bit store device and this result logically ORed with the delay time output of its corresponding second bit store device each producing its corresponding $P_s$.

$C_s$ of each unoccupied son, other than the first son, is logically ANDed with the complement of its corresponding external input signal and this result is logically ORed with the delay time output of its corresponding first bit store device each producing its corresponding present time input of each first bit store device. The complement of $C_s$ of each unoccupied son, other than the first son, is logically ANDed with its corresponding external input signal and this result logically ORed with the delay time output of its corresponding second bit store device each producing its corresponding present time input of each second bit store device. Additionally, $I_f$ of the level 1 cell is connected to $C_f$ of the level 1 cell.

In use, each external input signal is able to provide the information encoded in the input signal in a serial format having the most significant bit first. The external input signal having the minimum value produces a delay time output of a 1 logic level for its corresponding first bit store device.

Additionally, all unoccupied sons are ordered from 1 to x where x is an integer and $1 < x \leq 2^n$. The first son is of order 1. Also, y is an integer and $1 < y \leq x$. $C_s$ of the unoccupied son of order y equals the minimum value of the external input signals corresponding to unoccupied sons of order 1 through $y-1$, inclusive.

g. The Fetch-and-Maximum Primitive

Figure 26:
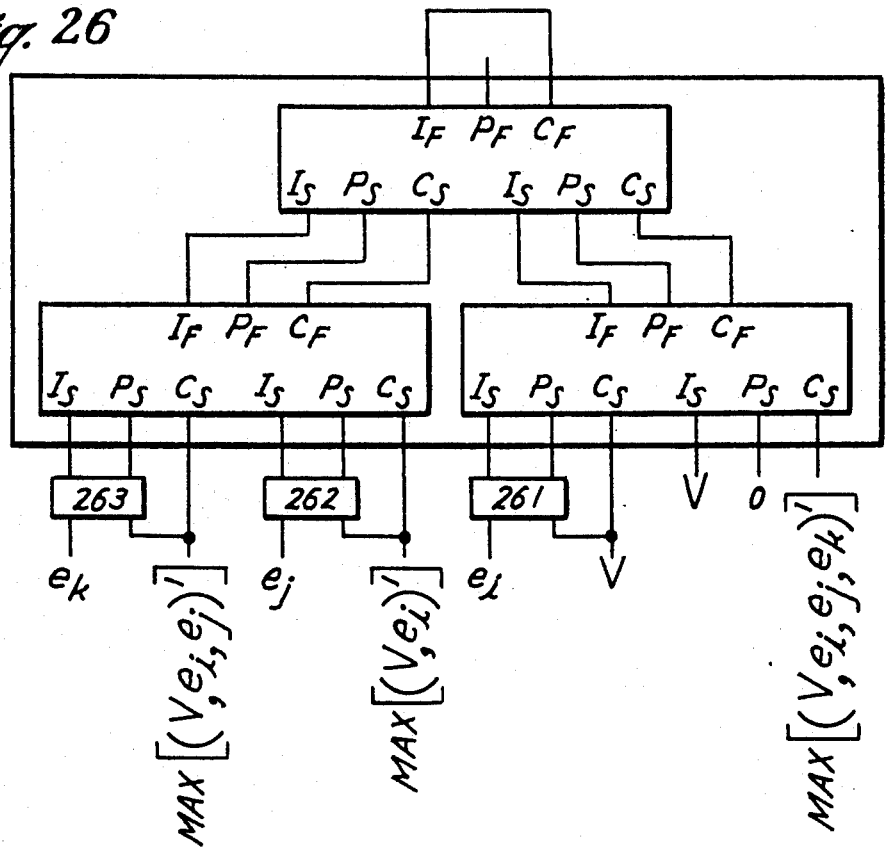
FIG. 26 is a two level logic operation circuit tree in accordance with the present invention performing a fetch-and-maximum primitive.

As shown in FIG. 26, the logic operation circuit of the invention is also able to realize the fetch-and-maximum primitive. $I_s$ of an unoccupied son, designated the first son, is connected to the complement of a memory variable V. $P_s$ of the first son is connected to a 0 logic level. All other unoccupied sons each has a first and a second bit store device, shown collectively in FIG. 26 as blocks 261, 262 and 263, and each bit store device has a present time input and a delay time output. Is of each unoccupied son, other than the first son, is connected to the delay time output of its corresponding first bit store device logically ANDed with the complement of a corresponding external input signal. Four external input signals $e_1$, $e_2$, $e_3$ and $e_4$ are shown in FIG. 26. All unoccupied sons, other than the first son, each has the complement of its corresponding external input signal logically ANDed with the complement of the delay time output of its corresponding first bit store device and this result logically ORed with the delay time output of its corresponding second bit store device each producing its corresponding $P_s$.

$C_s$ of each unoccupied son, other than the first son, is logically ANDed with its corresponding external input signal and this result is logically ORed with the delay time output of its corresponding first bit store device each producing its corresponding present time input of each first bit store device. The complement of $C_s$ of each unoccupied son, other than the first son, is logically ANDed with the complement of its corresponding external input signal and this result is logically ORed with the delay time output of its corresponding second bit store device each producing its corresponding present time input of each second bit store device. Additionally, $I_f$ of the level 1 cell is connected to $C_f$ of the level 1 cell.

In use, each external input signal is able to provide information encoded in the input signal in a serial format having the most significant bit first. The external input signal having the maximum value produces a delay time output of a 1 logic level.

Additionally, all unoccupied sons are ordered from 1 to x where x is an integer and $1 < x \leq 2^n$. The first son is of order 1. Also, y is an integer and $1 < y \leq x$. The complement of $C_s$ of the unoccupied son of order y equals the maximum value of the external input signals corresponding to unoccupied sons of order 1 through $y-1$, inclusive.

5. A Binary Adder

The present invention is also capable of realizing a binary adder. The addition occurs in parallel, that is each appropriate unoccupied son receives one bit of the value to be added. The value is not supplied serially.

The examination of a single selected unoccupied son is sufficient to describe the binary adder. A first external input signal is logically exclusive-ORed with a second external input signal producing $P_s$ of the selected unoccupied son. The first input signal is also logically ANDed with the second input signal producing $I_s$ of the selected son. A third external input signal is connected to $C_f$ of the level 1 cell.

The first external input signal is logically exclusive-ORed with the second external input signal and this result is logically exclusive-ORed with $C_s$ of the selected unoccupied son. The result is the binary sum of the first, second and third external input signals. Further, where the first and second external input signals correspond to a particular bit position, for example bit i of a binary number, and where the third external input signal corresponds to the carry bit from the addition of bits i−1, the present invention functions as a conventional adder.

6. Applications Beyond the Binary Tree

FIG. 2 shows two levels of a binary tree. Extension beyond a binary tree is obvious. If FIG. 2 is considered a node, that is one level, of a 4-ary tree, then the n level 4-ary tree can be readily constructed by substituting FIG. 2 for each node in the tree. In other words, the cell shown in FIG. 1 is simply replaced by the cells as shown in FIG. 2 to realize the 4-ary tree.

One skilled in the art will recognize that this can be extended to an n-ary tree. Also, the tree need not be full. As discussed earlier, leaf cells can occur at any level. This allows the possibility of integrating node logic into a processing element such that some or all nodes are attached to a processing element.

7. Widening the Data Paths in the Tree

Figure 7:
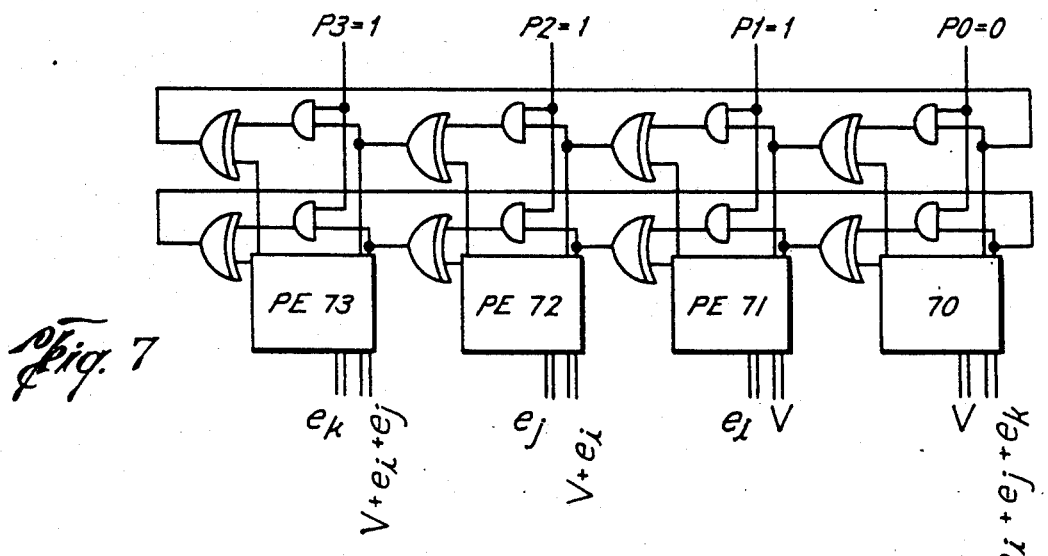
FIG. 7 is a parallel fetch-and-add circuit in accordance with the present invention.

The logic operation circuit detailed in the preferred embodiment deals with a 1 bit wide tree. One skilled in the art will recognize that a B bit wide tree may also be built. FIG. 7 shows a two bit wide parallel fetch-and-add circuit utilizing the present invention. PE71, PE72 and PE73 are 2 bit wide processing elements and block 70 is at least a 2 bit wide memory variable. Addition can be performed in this environment using B bit wide carry computation in each processor. The parallel fetch-and-add circuit shown in FIG. 7, as one skilled in the art will readily recognize, can be extended beyond fetch-and-add to include the logical operations discussed herein.

In implementing the fetch-and-add primitive, the processing element corresponding to the unoccupied son having $P_s$ equal to a 0 logic level, designated P0 in FIG. 7, has its carry values forced to 0.

8. Packet Switching

Figure 8:
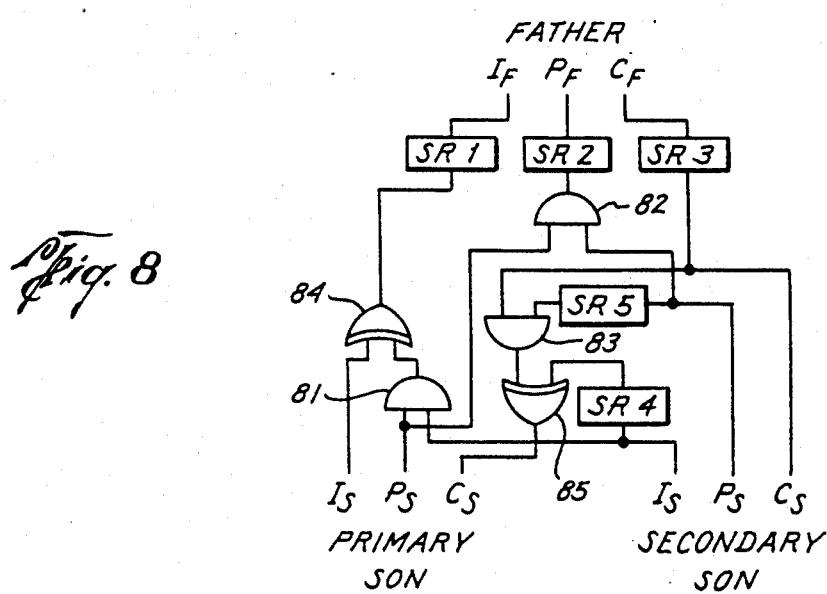
FIG. 8 is a packet-switched tree node circuit in accordance with the present invention.

The combinational fetch-and-operation tree can also be pipelined, that is, made packet-switched. This requires placing buffers between nodes and making the delays the same in all paths of the basic cell of the present invention by placing shift registers within each node as shown in FIG. 8. While this does not permit asynchronous packet-switching, this does avoid slowing the system clock down as the system size increases. In applications where many independent operations are done in succession, operands can be sent into the tree on every cycle and, after a latency period, results will appear in every cycle. Although this principle cannot be applied to speed up bit serial addition of a set of n operands, one per processor, where each processor has many operands to be added, the pipelined approach has greater throughput and is more efficient. The pipelined approach is the obvious choice if the tree is time-multiplexed among several variables such that each of V variables gets every V'th time cycle of the tree. In other words, the addition of the shift register delays is appropriate when the user wishes to place new data in the tree without waiting for earlier data to completely pass through the tree.

As shown in FIG. 8, one bit shift registers SR1, SR2 and SR3 are placed in signal lines $I_f$, $P_f$ and $C_f$, except in the root of the tree. Additionally, shift register SR4 is placed at the input to exclusive-OR gate 85 connected to $I_s$ of the secondary son. Shift register SR5 is placed at the input to AND gate 83 connected to $P_s$ of the secondary son. The number of bits required in each shift register SR4 and SR5 is determined by multiplying two times the number of levels in the tree that are above the particular node being examined. For example, where a particular node is at level 3 in a tree, then a six bit shift register would be used for both shift registers SR4 and SR5.

9. Architectural Ramifications

Architecturally, the circuit of the present invention is suited to single instruction, multiple data stream (SIMD) applications where all processors feed their data into the circuit at the same time and get the result in the same clock cycle. One skilled in the art will recognize that if multiple instruction, multiple data stream (MIMD) applications are desired, and if processes are compiled concurrently and then operated from a common system clock, the compiler may be able to assign the use of a single tree network to different functions or different variables at different times.

Figure 9:
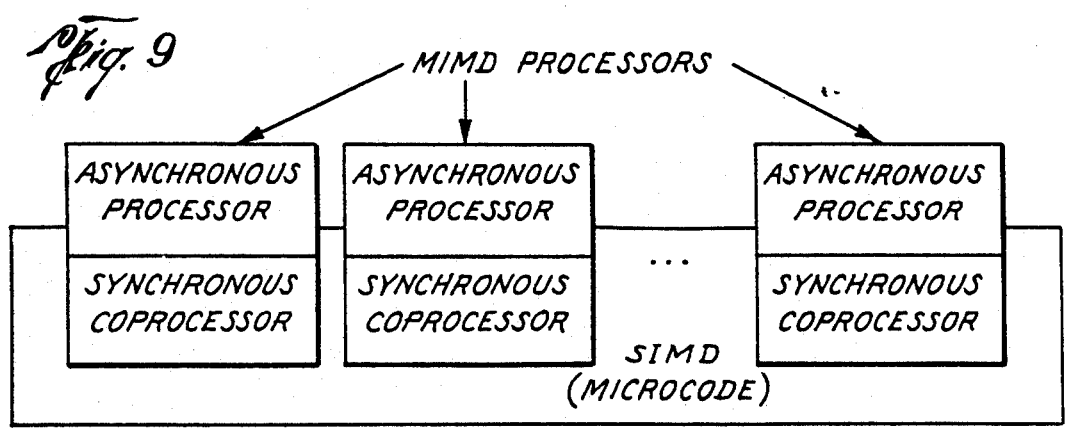
FIG. 9 is a block diagram in a multiple instruction, multiple data stream parallel processor in accordance with the present invention.

More generally, each asynchronous multiple instruction, multiple data stream processor can be connected to a co-processor which is synchronized with all other co-processors and operated in a single instruction of multiple data stream environment, preferably implemented in microcode, as shown in FIG. 9. This results in the co-processors running in a SIMD environment and the processors running in a MIMD environment.

Further, a tree can be partitioned into subtrees, where each subtree independently executes separate functions. Trees are created at the time processes are loaded and remain connected until the processes are terminated. Each separate tree can implement fetch-and-operation, operation-and-broadcast, or other functions already discussed.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made. For example, equivalent elements may be substituted for those described herein and certain features of the invention may be utilized independently of the use of other features, all as would be apparent to one skilled in the art after having the benefit of this description of the invention.

What is claimed is:

1. A logic operation circuit comprising:
   circuit input $C_f$ and circuit outputs $I_f$ and $P_f$ of a father;
   circuit inputs $I_s$ and $P_s$, and circuit output $C_s$ of a primary son of said father; and,
   circuit inputs $I_s$ and $P_s$, and circuit output $C_s$ of a secondary son of said father;
   $I_s$ of said primary son being a first input to a first exclusive-OR circuit;
   $P_s$ of said primary son being a first input to a first AND circuit and being a first input to a second AND circuit;
   $I_s$ of said secondary son being a second input to said first AND circuit and being a first input to a second exclusive-OR circuit;
   $P_s$ of said secondary son being a second input to said second AND circuit and being a first input to a third AND circuit;
   $C_f$ of said father being a second input to said third AND circuit and being $C_s$ of said secondary son;
   an output from said first exclusive-OR circuit being $I_f$ of said father;
   an output from said second AND circuit being $P_f$ of said father;
   an output from second exclusive-OR circuit being $C_s$ of said primary son;
   an output for said first AND circuit being a second input to said first exclusive-OR circuit; and
   an output for said third AND circuit being a second input to said second exclusive-OR circuit.

2. An n-level logic operation circuit, where n is an integer greater than 1, comprising a plurality of logic circuit cells, each logic circuit cell comprising:
   circuit input $C_f$ and circuit outputs $I_f$ and $P_f$ of a father;
   circuit inputs $I_s$ and $P_s$, and circuit output $C_s$ of a primary son of said father; and,
   circuit inputs $I_s$ and $P_s$, and circuit output $C_s$ of a secondary son of said father;
   $I_s$ of said primary son being a first input to a first exclusive-OR circuit;
   $P_s$ or said primary son being a first input to a first AND circuit and being a first input to a second AND circuit;
   $I_s$ of said secondary son being a second input to said first AND circuit and being a first input to a second exclusive-OR circuit;
   $P_s$ of said secondary son being a second input to said second AND circuit and being a first input to a third AND circuit;
   $C_f$ of said father being a second input to said third AND circuit and being $C_s$ of said secondary son;
   an output from said first exclusive-OR circuit being $I_f$ of said father;
   an output form said second AND circuit being $P_f$ of said father;
   an output from said second exclusive-OR circuit being $C_s$ of said primary son;
   an output from said first AND circuit being a second input to said first exclusive-OR circuit; and
   an output from said third AND circuit being a second input to said second exclusive-OR circuit;
   wherein:
   a highest level of said logic operation circuit being level 1 and a lowest level of said logic operation circuit being level n;
   level 1 of said logic operation circuit having one logic circuit cell;
   each level n of said logic operation circuit having less than or equal to $2^{(n-1)}$ logic circuit cells; and,
   each non-leaf and half-leaf cell in any level m, m being an integer and $1 \leq m < n$, having each occupied son exclusively connected to a corresponding cell at level m+1 wherein $I_s$, $P_s$ and $C_s$ of each said level m occupied son is respectively connected only to $I_f$, $P_f$ and $C_f$ of said corresponding level m+1 cell.

3. The logic operation circuit of claim 2 wherein:
   a first leaf cell comprises a memory variable connected to $I_s$ of a first unoccupied son of said first leaf cell;
   $I_s$ of all other unoccupied sons of all said logic operation circuit leaf cells each being connectable to a corresponding external input signal;
   $P_s$ of said first unoccupied son being connected to a 0 logic level;
   $P_s$ of said all other unoccupied sons being connected to a 1 logic level; and
   $I_f$ of said level 1 cell being connected to $C_f$ of said level 1 cell.

4. The logic operation circuit of claim 2 wherein:
   a first leaf cell comprises a memory variable connected to $I_s$ of a first unoccupied son of said first leaf cell;
   all other unoccupied sons of said logic operation circuit leaf cells each comprising:
   a bit store means having a present time input and a delay time output, and
   a majority circuit having a first, second and third input and an output, said first input being connected to $C_s$ of said corresponding unoccupied son, said second input being connectable to a corresponding external input signal, and said third input being connected to said corresponding delay time output;
   $I_s$ of said all other unoccupied sons each being connected to said corresponding delay time output logically exclusive-ORed with a corresponding connectable external input signal;
   $P_s$ of said first unoccupied son being connected to a 0 logic level;
   $P_s$ of said all other unoccupied sons each being connected to a 1 logic level; and
   $I_f$ of said level 1 cell being connected to $C_f$ of said level 1 cell.

5. The logic operation circuit of claim 2 wherein:
   a first leaf cell comprises a memory variable connected to $I_s$ of a first unoccupied son of said first leaf cell;
   $I_s$ of all other unoccupied sons of said logic operation circuit leaf cells each being connected to a 0 logic level;
   $P_s$ of said first unoccupied son being connected to a 0 logic level;
   $P_s$ of said all other unoccupied sons each being connectable to a corresponding external input signal; and
   $I_f$ of said level 1 cell being connected to $C_f$ of said level 1 cell.

6. The logic operation circuit of claim 2 wherein:

a first leaf cell comprises a memory variable, the complement of said memory variable being connected to $I_s$ of a first unoccupied son of said first leaf cell;

$I_s$ of all other unoccupied sons of said logic operation circuit leaf cells each being connected to a 0 logic level;

$P_s$ of said first unoccupied son being connected to a 0 logic level;

$P_s$ of said all other unoccupied sons each being connectable to the complement of a corresponding external input signal; and $I_f$ of said level 1 cell being connected to $C_f$ of said level 1 cell.

7. The logic operation circuit of claim 2 wherein:

all leaf cells and unoccupied sons of said leaf cells ar ordered, and the highest ordered unoccupied son being a first unoccupied son of a first leaf cell;

$P_s$ of said first unoccupied son being connected to a 0 logic level;

$P_s$ of all other unoccupied sons of said logic operation circuit leaf cells each being connectable to the complement of a corresponding external input signal;

$I_s$ of said first unoccupied son being connectable to the complement of a corresponding external input signal;

$I_s$ of all other unoccupied sons each being connected to a 0 logic level; and $I_f$ of said level 1 cell being connected to $C_f$ of said level 1 cell.

8. The logic operation circuit of claim 2 wherein:

all leaf cells and unoccupied sons of said leaf cells are ordered;

each said unoccupied son comprising a corresponding bit store means having a present time input and a delay time output;

$P_s$ of each said unoccupied son being connected to the complement of said corresponding delay time output logically ANDed with the complement of a corresponding external input signal;

$I_s$ of each said unoccupied son being connected to said corresponding delay time output;

each said external input signal being logically ORed with said corresponding delay time output producing an intermediate result, said intermediate result is logically ANDed with said corresponding $C_s$, and producing said corresponding present time input; and $I_f$ of said level 1 cell being connected to $C_f$ of said level 1 cell.

9. The logic operation circuit of claim 2 wherein:

all leaf cells and unoccupied sons of said leaf cells are ordered;

each said unoccupied son comprising: a bit store means having a present time input and a delay time output, and a majority circuit having a first, second, and third input and an output;

$P_s$ of each said unoccupied son being connected to the complement of a corresponding external input signal logically ORed with the complement of said corresponding delay time output;

$I_s$ of each said unoccupied son being connected to the complement of said corresponding external input signal ORed with said corresponding delay time output;

each said majority circuit having said first input connected to said corresponding $C_s$, said second input being connectable to said corresponding external input signal and said third input connected to said corresponding delay time output;

each said present time input being connected to said output of said corresponding majority circuit; and $I_f$ of said level 1 cell being connected to $C_f$ of said level 1 cell.

10. The logic operation circuit of claim 2 wherein:

$P_s$ of a first unoccupied son of a leaf cell being connected to a 0 logic level;

$I_s$ of said first unoccupied son being connectable to a first external input signal;

$P_s$ of a second unoccupied son of a leaf cell being connected to a 0 logic level;

$I_s$ of said second unoccupied son being connectable to a second external input signal;

all other unoccupied sons of said logic operation circuit leaf cells having $P_s$ connected to a 1 logic level and having $I_s$ connected to a 0 logic level; and $I_f$ of said level 1 cell being connected to $P_f$ of said level 1 cell.

11. The logic operation circuit of claim 2 wherein:

$P_s$ of a first unoccupied son of a leaf cell being connected to a 0 logic level;

$P_s$ of all other unoccupied sons of said logic operation circuit leaf cells being connected to a 1 logic level;

$I_s$ of said first unoccupied son being connectable to an external input signal;

$I_s$ of said all other unoccupied sons being connected to a 0 logic level; and $I_f$ of said level 1 cell being connected to $C_f$ of said level 1 cell.

12. The logic operation circuit of claim 2 wherein:

$P_s$ of all unoccupied sons of said logic operation circuit leaf cells being connected to a 0 logic level;

said all unoccupied sons each being connectable to a corresponding external input signal; and $I_f$ of said level 1 cell being connected to $C_f$ of said level 1 cell.

13. The logic operation circuit of claim 2 wherein:

$I_s$ of all unoccupied sons of all said logic operation circuit leaf cells being connected to a 0 logic level; and $P_s$ of said all unoccupied sons being connected to a 1 logic level.

14. The logic operation circuit of claim 2 wherein:

$I_s$ of all unoccupied sons of all said logic operation circuit leaf cells being connected to a 0 logic level;

$P_s$ of said all unoccupied sons each being connectable to a corresponding external input signal; and $P_f$ of said level 1 cell being connected to $C_f$ of said level 1 cell.

15. The logic operation circuit of claim 2 wherein:

$I_s$ of all unoccupied sons of said logic operation circuit leaf cells being connected to a 0 logic level;

$P_s$ of said all unoccupied sons each being connectable to the complement of a corresponding external input signal; and $P_f$ of said level 1 cell being connected to $C_f$ of said level 1 cell.

16. The logic operation circuit of claim 2 wherein:

each unoccupied son of said leaf cells comprises a bit store means having a present time input and a delay time output;

$I_s$ of said all unoccupied sons being connected to a 0 logic level;

$P_s$ of said all unoccupied sons each being connectable to a corresponding external input signal logically ORed with said corresponding delay time output;

$C_s$ of said all unoccupied sons each being logically exclusive-ORed with said corresponding external input signal producing a first signal, each said first signal being logically ORed with said corresponding delay time output producing a second signal, and each said second signal being connected to said corresponding present time input; and $P_f$ of said level 1 cell being connected to $C_f$ of said level 1 cell.

17. The logic operation circuit of claim 2 wherein:

each unoccupied son of said leaf cells comprises a bit store means having a present time input and a delay time output;

$I_s$ of said all unoccupied sons being connected to a 0 logic level;

$P_s$ of said all unoccupied sons each being connected to the complement of a corresponding connectable external input signal ORed with said corresponding delay time output;

$C_s$ of said all unoccupied sons each being logically exclusive-ORed with the complement of said corresponding external input signal producing a first signal, each said first signal being logically ORed with said corresponding delay time output producing a second signal, and said second signal being connected to said corresponding present time input; and $P_f$ of said level 1 cell being connected to $C_f$ of said level 1 cell.

18. The logic operation circuit of claim 2 further comprising:

a bit store means having a present time input and a delay time output;

said present time input being connected to $I_f$ of said level 1 cell during a first time period;

said delay time output being connected to $C_f$ of said level 1 cell during a second time period;

$P_s$ of all unoccupied sons of said logic operation circuit leaf cells being connected to a 1 logic level; and $I_s$ of said all unoccupied sons each being connectable to a corresponding external input signal during said first time period and being connected to a 0 logic level during said second time period.

19. The logic operation circuit of claim 2 wherein:

a first leaf cell comprises a memory variable connected to $I_s$ of a first unoccupied son of said first leaf cell;

$P_s$ of said first unoccupied son being connected to a 0 logic level;

all other unoccupied sons of said logic operation circuit leaf cells each having a first bit store means comprising a present time input and a delay time output;

said all other unoccupied sons each having a second bit store means comprising a present time input and a delay time output;

$I_s$ of said all other unoccupied sons each being connected to said corresponding delay time output of said first bit store means logically ANDed with a corresponding connectable external input signal;

said all other unoccupied sons each having said corresponding external input signal logically ANDed with the complement of said corresponding delay time output of said first bit store means producing a first intermediate signal, each said first intermediate signal being logically ORed with said corresponding delay time output of said second bit store means, and each producing $P_s$ of said unoccupied son;

$C_s$ of each said other unoccupied son being logically ANDed with the complement of said corresponding external input signal producing a second intermediate signal, each said second intermediate signal being logically ORed with said corresponding delay time output of said first bit store means, and each producing said present time input of said corresponding first bit store means;

the complement of $C_s$ of each said other unoccupied son being logically ANDed with said corresponding external input signal producing a third intermediate signal, each said third intermediate signal being logically ORed with said corresponding delay time output of said second bit store means, and each producing said present time input of said second bit store means of said unoccupied son; and $I_f$ of said level 1 cell being connected to $C_f$ of said level 1 cell.

20. The logic operation circuit of claim 2 wherein:

a first leaf cell comprises a memory variable connected to $I_s$ of a first unoccupied son of said first leaf cell;

$P_s$ of said first unoccupied son being connected to a 0 logic level;

all other unoccupied sons of said logic operation circuit leaf cells each having a first bit store means comprising a present time input and a delay time output;

said all other unoccupied sons each having a second bit store means comprising a present time input and a delay time output;

$I_s$ of said all other unoccupied sons each being connected to said corresponding delay time output of said first bit store means logically ANDed with the complement of a corresponding connectable external input signal;

said all other unoccupied sons each having the complement of said corresponding external input signal logically ANDed with the complement of said corresponding delay time output of said first bit store means producing a first intermediate signal, each said first intermediate signal being logically ORed with said corresponding delay time output of said second bit store means, and each producing $P_s$ of said unoccupied son;

$C_s$ of each said other unoccupied son being logically ANDed with said corresponding external input signal producing a second intermediate signal, and each said second intermediate signal being logically ORed with said corresponding delay time output of said first bit store means, each producing said present item input of said corresponding first bit store means;

the complement of $C_s$ of said other unoccupied son being logically ANDed with the complement of said corresponding external input signal producing a third intermediate signal, each said third intermediate signal being logically ORed with said corresponding delay time output of said second bit store means, and each producing said present time input of said corresponding second bit store means; and $I_f$ of said level 1 cell being connected to $C_f$ of said level 1 cell.

* * * * *

UNITED STATES PATENT AND TRADEMARK OFFICE
CERTIFICATE OF CORRECTION

PATENT NO. : 5,192,882
DATED : March 9, 1993
INVENTOR(S) : G. Jack Lipovski

It is certified that error appears in the above-indentified patent and that said Letters Patent is hereby corrected as shown below:

Column 17, line 32 (claim 1), delete "for" and replace with --from--.

Column 17, line 34 (claim 1), delete "for" and replace with --from--.

Column 17, line 47 (claim 2), delete "or" and replace with --of--.

Column 17, line 60 (claim 2), delete "form" and replace with --from--.

Column 19, line 16 (claim 7), delete "ar" and replace with --are--.

Column 19, line 28 (claim 7), insert the word --said-- before the word "all".

Column 22, line 56 (claim 20), delete "item" and replace with --time--.

UNITED STATES PATENT AND TRADEMARK OFFICE
CERTIFICATE OF CORRECTION

PATENT NO. : 5,192,882
DATED : March 9, 1993
INVENTOR(S) : G. Jack Lipovski

It is certified that error appears in the above-indentified patent and that said Letters Patent is hereby corrected as shown below:

Column 22, line 58, (claim 20), between "of" and "said" insert --each--.

Signed and Sealed this

Sixteenth Day of November, 1993

Attest:

BRUCE LEHMAN

Attesting Officer     Commissioner of Patents and Trademarks